(12) United States Patent
Shigematsu

(10) Patent No.: US 6,947,121 B2
(45) Date of Patent: Sep. 20, 2005

(54) PROJECTION OPTICAL SYSTEM, A PROJECTION EXPOSURE APPARATUS PROVIDED WITH THE SAME, AS WELL AS A DEVICE MANUFACTURING METHOD

(75) Inventor: Koji Shigematsu, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/459,559

(22) Filed: Jun. 12, 2003

(65) Prior Publication Data

US 2003/0210385 A1 Nov. 13, 2003

Related U.S. Application Data

(63) Continuation of application No. 09/587,269, filed on Jun. 5, 2000, now Pat. No. 6,600,550.

(30) Foreign Application Priority Data

Jun. 3, 1999 (JP) .............................. 11-156995

(51) Int. Cl.$^7$ ....................... G03B 27/42; G03B 27/52; G02B 15/14
(52) U.S. Cl. ........................ 355/53; 355/55; 359/683
(58) Field of Search ........................ 355/52, 53, 55, 355/67–71; 356/399–401; 250/548; 359/683

(56) References Cited

U.S. PATENT DOCUMENTS

| | | | |
|---|---|---|---|
| 4,498,742 A | 2/1985 | Uehara | |
| 4,734,746 A | 3/1988 | Ushida et al. | |
| 5,194,893 A | 3/1993 | Nishi | |
| 5,260,832 A | 11/1993 | Togino et al. | |
| 5,345,292 A | 9/1994 | Shiozawa et al. | |
| 5,359,388 A | 10/1994 | Hollman | |
| 5,448,336 A | 9/1995 | Shiraishi | |
| 5,473,410 A | 12/1995 | Nishi | |
| 5,477,304 A | 12/1995 | Nishi | |
| 5,530,518 A | 6/1996 | Ushida et al. | |
| 5,646,715 A | 7/1997 | Wangler | |
| 5,668,672 A * | 9/1997 | Oomura | ...................... 359/727 |
| 5,675,401 A | 10/1997 | Wangler et al. | |
| 5,691,802 A * | 11/1997 | Takahashi | ...................... 355/53 |
| 5,781,278 A * | 7/1998 | Matsuzawa et al. | .......... 355/53 |
| 5,835,285 A | 11/1998 | Matsuzawa et al. | |
| 5,854,671 A | 12/1998 | Nishi | |
| 5,903,400 A | 5/1999 | Endo | |
| 5,930,049 A | 7/1999 | Suenaga et al. | |
| 5,990,926 A * | 11/1999 | Mercado | ...................... 347/258 |
| 6,084,723 A | 7/2000 | Matsuzawa et al. | |
| 6,118,516 A | 9/2000 | Irie et al. | |
| 6,259,508 B1 | 7/2001 | Shigematsu | |
| 6,683,729 B1 | 1/2004 | Schuster | |

OTHER PUBLICATIONS

Nikon's news release entitled "Ordering to Start for Nikon's New Step–and–Repeat Exposure System NSR–SF100"; dated Nov. 29, 1999.

* cited by examiner

Primary Examiner—Henry Hung Nguyen
(74) Attorney, Agent, or Firm—Finnegan, Henderson, Farabow, Garrett and Dunner, L.L.P.

(57) ABSTRACT

The present invention is directed toward a high performance yet compact projection optical system that is both-sidedly telecentric, has the ability to minimize the reduction of image formation performance that occurs due to the absorption by the glass material used, can secure a sufficiently large numerical aperture and a broad exposure area, and has the ability to very favorably correct aberrations and especially distortion. In a projection optical system that projects a pattern of a first object onto a second object, comprising in order from the first object side, a positive first lens group, a negative second lens group, a positive third lens group, a negative fourth lens group, and positive fifth lens group that provides at least 2 negative lens compositions, and where the fifth lens group includes two lens planes that satisfy the expression $\phi/\phi\exp \leq 3.5$, and a first lens composition L59 constituted of a first material that satisfies the expression $n \leq 1.57$, and where the entire projection optical system described above has two lens planes that satisfy the expression $\phi/\phi\exp > 3.5$, and which includes a second lens composition L34 constituted of a second material that satisfies the expression $n > 1.57$.

18 Claims, 15 Drawing Sheets

COMA ABERRATION

TANGENTIAL                    SAGITTAL

IMAGE/HEIGHT
RATIOS

COMA ABERRATION

TANGENTIAL                    SAGITTAL

IMAGE/HEIGHT
RATIOS 1.00

0.75

0.50

0.25

0.00

PROJECTION OPTICAL SYSTEM, A PROJECTION EXPOSURE APPARATUS PROVIDED WITH THE SAME, AS WELL AS A DEVICE MANUFACTURING METHOD

This is a continuation of application Ser. No. 09/587,269, filed Jun. 5, 2000, now U.S. Pat. No. 6,600,550.

BACKGROUND OF THE INVENTION

1. Field of the Invention

The present invention relates to a manufacturing method of a device (such as a semiconductor elemental device, photo-imaging elemental device, flat panel display device such as a LCD (liquid crystal display) element device, a PDP (plasma display panel) element device, EL (electroluminescent) display element device, FED (field emission display) element device, Electric Paper display element device etc., thin film magnetic head elemental device, and so forth) that uses a projection exposure apparatus at the time of photo-transferring a mask pattern onto a substrate within the process of lithography for manufacturing the device, wherein the projection optical system for projecting the image of the pattern of the first object onto the second object and the projection optical system thereof are provided.

2. Description of the Related Art

When manufacturing a semiconductor elemental device or so forth, a projection exposure apparatus in a scanning exposure format is used like that of a batch exposure format or the step-and-scan method where a stepper is used to transfer an image of a reticle pattern through a projection optical system as a mask onto a wafer (or glass plate or so forth) that has a photo resist applied thereon. Further, in accordance with the advancement of the refining of patterns such as that of a semiconductor integrated circuit, the demand for increased performance in the projection optical system used in these projection exposure apparatuses is growing, especially in regards to the improvement of the resolving power of a projection optical system. In order to improve this resolving power, the shortening of the exposure wavelength or the increasing of the numerical aperture (N.A.) can be conceived.

With the projection exposure apparatus described above, the i line (365 nm) from the g line (436 nm) of the mercury vapor lamp is used as the exposure light with recent trends moving towards a shorter wavelength. For this reason, a projection optical system that can be used in conjunction with a short wavelength exposure light is being developed.

Furthermore, in conjunction with the improvement of the resolving power, the demand for minimized image warping in projection optical systems is ever increasing. In addition to that caused by distortion, which originates in the projection optical system, there is image warping that is caused by the bend of the wafer that is printed by the image side of the projection optical system as well as that caused by the bend of the reticle drawn by the circuit pattern on the object side of the projection optical system.

In recent years, the refinement of the transferred pattern is increasingly advanced, and the demand for minimized image warping is ever increasing. Therefore, in order to reduce the effect on the image warping due to the bend of the wafer, a so-called image-side telecentric optical system has been conventionally used that places the image side exit pupil position of the projection optical system farther away. Meanwhile, in regard to the reduction of the image warping due to the bend of the reticle, a so-called object-side telecentric optical system can be conceived that places the entrance pupil position of the projection optical system farther away from the object plane, and there are proposals for moving the entrance pupil position of the projection optical system comparatively farther away in this manner.

In order to improve the resolving power, the problem lies in the reduction of the transmission factor of the glass material constitutes the projection optical system when using an exposure light with a short wavelength, and in the limited availability of glass material that can be used to secure a high transmission factor. Furthermore, the reduction of the transmission factor is not due exclusively to the loss of the amount of light. Rather, because a portion of the lost light is absorbed into the glass material and through its conversion to heat energy, the refractive index of the glass material of the lens changes or the shape of the lens surface changes, thereby resulting in a reduction of the performance of image formation and especially causing fluctuation in the aberration in the exposure. Moreover, the aberration fluctuation in the exposure is also a reverse phenomenon since it disappears when the heat energy in the lens composition disappears after completing exposure, or in other words, when the heated lens cools.

SUMMARY OF THE INVENTION

The advantages and purposes of the invention will be set forth in part in the description which follows, and in part will be obvious from the description, or may be learned by practice of the invention. Moreover, the advantages and purposes of the invention will be realized and attained by means of the elements and combinations particularly pointed out in the appended claims.

The present invention takes into account the exemplary problems described above in providing a compact yet high performance projection optical system that is extremely favorable in correcting distortion, various aberrations, and maintaining a sufficiently large numerical aperture as well as a broad exposure area while minimizing the reduction in image formation performance due to the absorption by the glass material used, and it is telecentric relative to both sides.

To solve the exemplary problems described above, the present invention provides, in a projection optical system for projecting the pattern of a first object onto a second object, in order from the first object side, a first lens group having a positive refractive power, a second lens group having a negative refractive power, a third lens group having a positive refractive power, a fourth lens group having a negative refractive power, and a fifth lens group having a positive refractive power and which provides at least two negative lenses.

The first lens group, while maintaining telecentricity, mainly contributes to the correction of the distortion. The second lens group and the fourth lens group contribute mainly to the correction of the Petzval sum and achieve desired flattening of the image plane. Further, the third lens group, in conjunction with the first lens group, generates positive distortion thereby performing the function of correcting the negative distortion generated by the second, fourth and fifth lens groups. In addition, the third lens group and the second lens group, when viewed from the second object, are composed of a telephoto system having a positive and negative refractive power arrangement, and on account of this, have a function that prevents the elongation of the entire projection optical system. The fifth lens group, in order to sufficiently respond to the high numerical aperture at the second object side, suppresses the generation of distortion by maintaining a state of extreme avoidance of especially spherical aberration and thereby performs the role of image formation by leading the luminous flux to the second object.

Further, it is favorable when the present invention satisfies the following conditional expressions (1), (2), (3), and (4). The fifth lens group includes a first lens, two lens surfaces of the first lens satisfy the following condition (1):

$$\phi1/\phi\text{exp} \leq 3.5 \tag{1}$$

the first lens made of a first material having a refractive index that satisfies the following condition (2):

$$n1 \leq 1.57 \tag{2}$$

where φexp is a diameter of an exposure area on the second object; φ1 is a diameter of a clear aperture of the two lens surfaces of the first lens; and n1 is a refractive index of the first lens. Further, the radius of the clear aperture indicates the distance from the optical axis to the point where reach the reverse traced marginal ray of the beam has the maximum numerical aperture, from the peripheral point of the maximum exposure area where practically corrected aberrations (clear aperture diameter of a lens surface indicates a diameter of a circle including an area of section of a whole beam which pass through the lens surface). Moreover, the exposure area indicates the area defined by the circle where the length of the diagonal line of the short exposure area, or in other words, the area defined by that short exposure area inscribed by or included within the circle. The exposure area diameter indicates the diameter of the circular exposure area described above.

Preferably, the glass (i.e., optical glass) material has a better transmission factor in the short wavelength area than general glass material having a low refractive index. Moreover, the position of the lens that satisfies conditional expression (1) can be regarded as a high energy density of exposure light position. Since a lens having exposure light with a high energy density secures a higher transmission factor, a glass material having a refractive index that satisfies the conditional expression (2) is used. Accordingly, the reduction of the image formation performance that occurs on account of the reduction of the transmission factor can be suppressed.

On the other hand, the use of a glass material having a refractive index that exceeds the upper limit value of conditional expression (2) as the lens having exposure light with a high energy density which satisfies conditional expression (1), is not favorable because it leads to the reduction of the image formation performance, which occurs due to the reduction in the transmission factor.

Furthermore, with the present invention, the entire projection optical system preferably includes a second lens with two lens surfaces that satisfy the following condition (3):

$$\phi2/\phi\text{exp} > 3.5 \tag{3}$$

where φ2 is a diameter of a clear aperture of the two lens surfaces of the second lens, the second lens made of a second material has a refractive index (n2) that satisfies the following condition (4):

$$n > 1.57 \tag{4}$$

By providing a composition that has 1 or more lenses of a lens that satisfy conditional expression (4) in a lens that is comparatively low in energy density of the exposure light that satisfies conditional expression (3), the refractive power in the entire projection optical system is improved. In this way, favorable aberration correction is possible and a compact optical system can be obtained. Conversely, by providing a lens that does not completely satisfy conditional expression (4) but is comparatively low in energy density of the exposure light that satisfies conditional expression (3), the refractive power in the entire projection optical system is unable to be increased, which leads to unfavorable elongation of the projection optical system.

In addition, the present invention preferably satisfies the following conditional expression $$t5'/t5 \geq 0.2 \tag{5}$$

where the parameter t5 is defined as the sum of the thickness along the optical axis of all of the lenses constituting the fifth lens group described above, and the parameter t5' is defined as the sum of the thickness along the optical axis of a first lens in the fifth lens group described above.

Conditional expression (5) regulates the ratio of the sums of thickness of the glass material used to raise the transmission factor since the energy density of exposure light is comparatively high in relation to the sum of the thickness of the glass material in the fifth lens group that performs the function of image formation and which leads the beam onto the second object. By satisfying the conditional expression (5), it becomes possible to suppress the reduction of the image formation performance that occurs due to the reduction of the transmission factor. Exceeding the upper limit value of conditional expression (5) leads to a reduction of the image formation performance that occurs due to the reduction of the transmission factor.

Moreover, with the present invention, f1 designates the focal length of the first lens group; and f2 designates the focal length of the second lens group; and f3 designates the focal length of the third lens group; and f4 designates the focal length of the fourth lens group; and f5 designates the focal length of the fifth lens group; and L designates the axial distance from the first object to the second object. Preferably, the present invention satisfies at least one of the following (6) through (10) conditions.

$$0.04 < f1/L < 0.4 \tag{6}$$

$$0.015 < -f2/L < 0.15 \tag{7}$$

$$0.02 < f3/L < 0.2 \tag{8}$$

$$0.015 < f4/L < 0.15 \tag{9}$$

$$0.03 < f5/L < 0.3 \tag{10}$$

More preferably, the present invention operates most effectively when each of the conditions (6) through (10) described above are simultaneously satisfied.

Conditional expression (6) regulates the range of optimal refractive power for the first lens group. When exceeding the upper limit value of conditional expression (6), the positive distortion generated by the first lens group becomes less able to correct the negative distortion generated by the second, fourth and fifth lens groups and is therefore unfavorable. When falling below the lower limit value of the conditional expression (6), this becomes the cause of the generated higher order positive distortion and is therefore not favorable.

Conditional expression (7) regulates the range of optimal refractive power for the second lens group. When exceeding the upper limit value of conditional expression (7), the correction of the Petzval sum becomes insufficient and it becomes more difficult to achieve the flattening of the image plane. Therefore, exceeding such an upper limit is unfavorable. Conversely, when falling below the lower limit of conditional expression (7), the generation of negative distortion becomes larger, thereby making it more difficult to favorably correct this larger negative distortion with only the first and third lens groups. As a result, falling below this lower limit is also not favorable.

Conditional expression (8) regulates the range of optimal refractive power for the third lens group. When exceeding the upper limit value of conditional expression (8), the telephoto ratio of the telephoto system formed by the combination of the second lens group and the third lens group becomes larger, and in addition to leading to the elongation of the entire projection optical system, the generated amount of positive distortion generated by the third lens group becomes smaller thereby becoming less effective in favorably correcting the negative distortion generated by the second, fourth and fifth lens groups, and therefore is not favorable. Conversely, when falling below the lower limit value of the conditional expression (8), high order spherical aberration is generated thereby making it not possible to obtain favorable image formation performance on the second object and therefore is not favorable.

Conditional expression (9) regulates the range of optimal refractive power for the fourth lens group. When exceeding the upper limit value of conditional expression (9), the correction of the Petzval sum becomes insufficient and it becomes more difficult to achieve the flattening of the image plane and therefor it is unfavorable. Conversely, falling below the lower limit of conditional expression (9) causes the generation of a high order spherical aberration and a comatic aberration and therefore is not favorable.

Moreover, conditional expression (10) regulates the range of optimal refractive power for the fifth lens group. When exceeding the upper limit value of conditional expression (10), the refractive power of the entire fifth lens group becomes too weak, thereby leading to the elongation of the entire projection optical system and therefore is not favorable. Conversely, falling below the lower limit value of conditional expression (10) generated a high order spherical aberration thereby leading to a reduction in the image contrast on the second object and therefore is not favorable.

Furthermore, the present invention preferably employs at least one negative lens in the fifth lens group that satisfies the following conditional expression $$\phi 5n/\phi 5max \geq 0.7, \tag{11}$$

where $\phi 5n$ designates the maximum clear aperture diameter among clear apertures of negative lenses in the fifth lens group, and $\phi 5max$ is designated as the maximum clear aperture diameter among the clear apertures of a plurality of lenses in the fifth lens group.

By the clear aperture diameter of at least one negative lens included in the fifth lens group satisfying the conditional expression (11), the negative spherical aberration generated by the fifth lens group is effectively corrected thereby making it possible for a high contrast image to be formed on the second object. On the other hand, if the clear aperture of at least one negative lens included in the fifth lens group were to fall below the lower limit of the conditional expression (11), the negative spherical aberration generated by the fifth lens group could not be corrected, thereby leading to a reduction in the contrast of the image on the second object and therefore it is not favorable.

Furthermore, the present invention preferably operates when the following conditional expression.

$$F/L \geq 0.6, \tag{12}$$

is satisfied. Here, F represents the focal length of the projection optical system, and L refers to the distance from the first object to the second object. Conditional expression (12) regulates the condition for establishing both-sided telecentricity (bi-telecentricity). By satisfying conditional expression (12), it becomes possible to achieve an optical system that does not generate image distortion even if there is bending in the reticle and wafer.

Further, the present invention provides a projection exposure apparatus comprising a first stage for holding the mask for the first object, and an illumination optical system for illuminating the mask, and a second stage for holding the substrate for the second object, and a projection optical system for projecting and exposing the image of the pattern of the illuminated mask onto the substrate from the illumination optical system.

Since the projection optical system according to the present invention provides both-sided telecentricity and a large numerical aperture, in conjunction with being capable of obtaining a high resolution, the projection magnification does not change even if there is curving in the mask or substrate. Furthermore, since a broad exposure area can be obtained, a large pattern can be exposed at once. Moreover, by the use of a glass material having a high transmission factor with a low refractive index, the reduction to the image formation performance occurring due to the absorption by the glass material can be suppressed, thereby achieving a high image formation performance.

Additionally, the present invention provides a device manufacturing method comprised so as to have a process for applying photo-sensitive material onto a substrate as the second object, and a process for projecting the image of the pattern of the mask of the first object through the projection optical system described in Claims 1 or 2 onto the substrate, and a process for developing the photo-sensitive material onto the substrate, and a process for forming a predetermined circuit pattern onto the substrate as a mask of the photo-sensitive material subsequent to developing. By the use of the projection exposure apparatus of the present invention, a circuit pattern for use with a device can be formed with a high resolution onto a substrate.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Reference will now be made in detail to the present preferred embodiments of the invention illustrated in the accompanying drawings. Wherever possible, the same reference numbers are used throughout the drawings to refer to the same or like parts.

Figure 1:
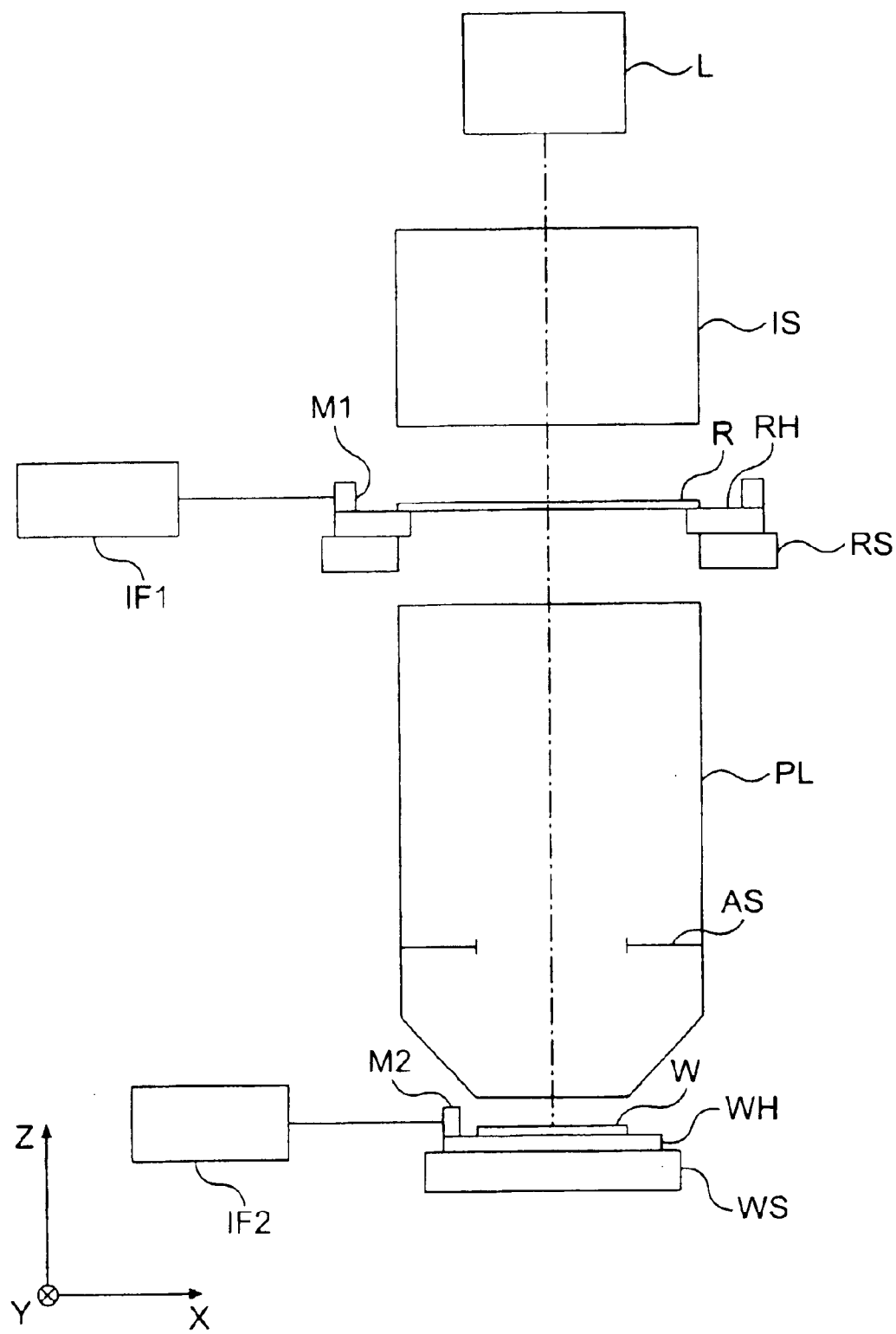
FIG. 1 illustrates the schematic view of the projection exposure apparatus that provides the projection optical system related to an embodiment of the present invention.

Hereafter, an example of the embodiment of the present invention will be described with reference to figures. FIG. 1 is a drawing briefly showing the entire configuration of the projection exposure apparatus that provides the projection optical system related to each embodiment of the present invention. Moreover, FIG. 1 establishes axis Z that is parallel to the optical axis AX of the projection optical system PL, and it establishes the X axis that is parallel to the surface of the paper for FIG. 1 in an orthogonal plane to optical axis AX, and it establishes axis Y being orthogonal to the surface of the paper. Further, the reticle R is arranged as a projection original being formed by a predetermined circuit pattern on the object plane of the projection optical system PL, and the wafer W that is applied by the photoresist as a substrate is arranged on the image plane of projection optical system PL.

The light that is emitted from the light source L, through the illumination system IS, illuminates uniformly the reticle R that is formed by the predetermined pattern. Furthermore, one or more folding mirrors (not shown) are arranged to change the light path as necessary from the light source L to the light path of the illumination system IS.

Furthermore, the illumination system IS, for example, has a variable field stop (reticle blind), an optical system such as a field stop (reticle blind) imaging optical system that projects an image of the field stop onto a reticle, for regulating the size and shape of the illumination area on the reticle R and the optical integrator that forms the secondary light source of a predetermined size and shape from an internal reflecting integrator and a fly's eye lens for unifying the illuminated portion of the exposure light. Moreover, the illumination system disclosed in U.S. Pat. No. 5,345,292 for example, can be given as an applicable optical system from the light source L to the field stop.

The reticle R, through the reticle holder RH, is kept parallel to the flat plane XY on the reticle stage RS. In the reticle R, the pattern to be transferred is formed, and the entire pattern area is illuminated with light from the illumination system IS. The reticle stage RS is arranged so as to, by way of the action of the drive system that is omitted from the figure, have the ability to move two dimensionally along the reticle plane (in other words, the XY plane), and the position coordinates thereof are measured and such position controlled by the interferometer IF1 that uses the reticle movement mirror M1.

The light from the pattern that is formed by the reticle $R_i$ through the projection optical system PL, forms the mask pattern image on the wafer W that is a photosensitive plate (workpiece). The projection optical system PL, in addition to having an aperture stop (AS) with a variable opening diameter in the vicinity of the pupil position thereof, is essentially telecentric with respect to the reticle R side and the wafer W side.

The wafer W, through the wafer holder WH, is held parallel to the flat plane XY on the wafer stage WS. Further, the pattern image is formed in the exposure area of essentially the same shape as the illumination area on the reticle R.

The wafer stage WS is arranged so as to, by way of the action of the drive system that is omitted from the figure, have the ability to move two dimensionally along the wafer plane (in other words, the XY plane), and the position coordinates thereof are measured and such position controlled by the interferometer IF2 that uses the wafer movement mirror M2.

After performing the position alignment of the reticle R and the wafer W using the interferometers (IF1, IF2) and the drive system described above and the alignment system not shown in the figure, and after determining the position of the wafer W to the image formation plane of the projection optical system by using the autofocus and autoleveling system not shown in the figure, the pattern of the reticle R is transferred to one exposure area (short area) on the wafer 1 by illuminating the exposure light onto the pattern area of the reticle R. Thereafter, the wafer is moved within the XY plane using the drive system and interferometer (IF) then the pattern of reticle R is transferred to an area on wafer W that is different from the exposure area described above.

I. PREFERRED EMBODIMENT EXAMPLE 1

Figure 2:
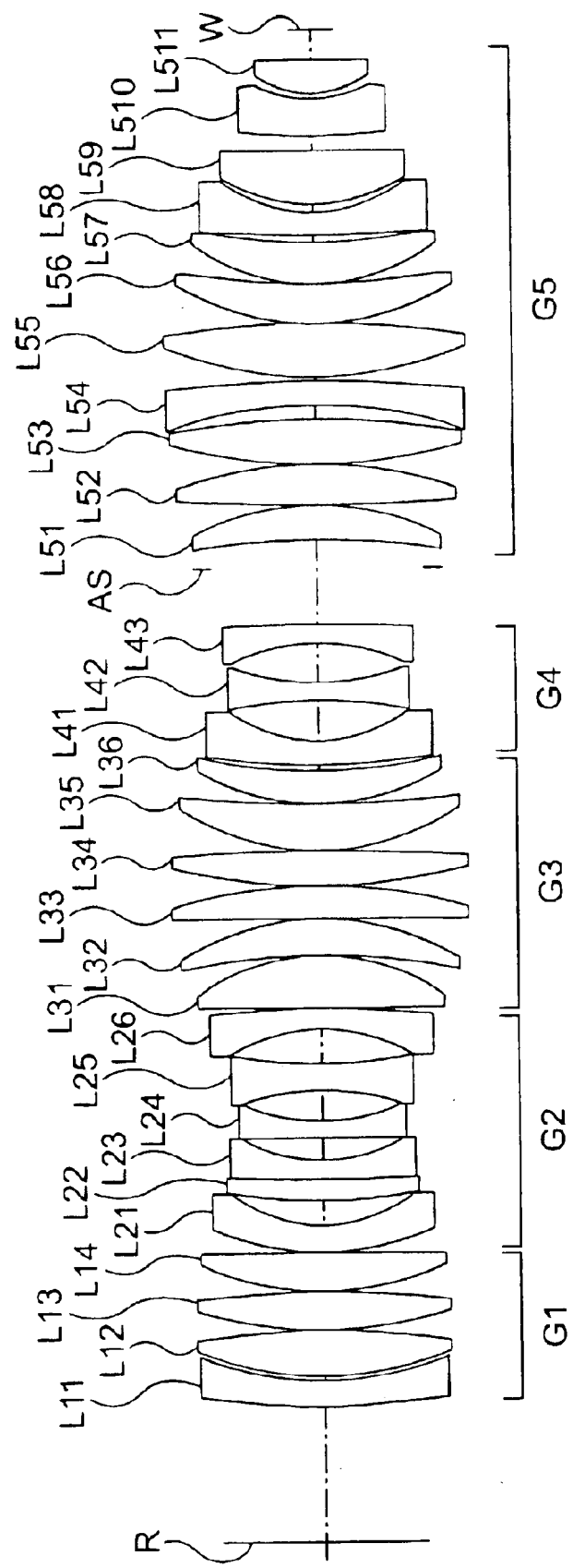
FIG. 2 illustrates the lens sectional view of the projection optical system that relates to a first embodiment of the present invention.

FIG. 2 is a drawing that shows the lens construction of the projection optical system that relates to the first embodiment. This embodiment has, relative to the reticle R (object plane) as the first object, a first lens group G1 having a positive refractive power and with at least one negative lens L11; and a second lens group G2 having a negative refractive power; and a third lens group G3 having a positive refractive power; and a fourth lens group G4 having a negative refractive power; and a fifth lens group G5 having a positive refractive power with at least two negative lenses L54 and L58. Furthermore, it is both-sidedly telecentric on the wafer W (image plane) side for the second object and the reticle R (object plane) side.

Further, with the fifth lens group described above of the projection optical system of FIG. 2, the lens L59, L510, L511 are comprised so as to satisfy the conditional expressions (1) and (2). In this manner, a higher transmission factor can be secured in a lens with a high energy density of the exposure light thereby making it possible to suppress the reduction of the image formation performance that occurs due to the reduction of the transmission factor.

In addition, the present invention employs one or more lenses with lens composition L34 that satisfies conditional expressions (3) and (4). In this manner, a higher refractive index can be secured in a lens with comparatively low energy density for the exposure light thereby making favorable aberration correction possible and realizing a compact optical system.

In the fifth lens group G5, the lens L59, L510, L511 that satisfy the conditional expressions (1) and (2) satisfy the conditional expression (5). In this manner, a higher transmission factor can be secured in a lens with a high energy density of the exposure light thereby making it possible to suppress the reduction of the image formation performance that occurs due to the reduction of the transmission factor.

Moreover, the focal length between each of the lens groups G1 through G5 satisfies the conditional expressions (6) through (10). Accordingly, while being both-sidedly telecentric and securing a sufficiently high numerical aperture and broad exposure area, it realizes a high performance yet compact projection optical system, which has the ability to very favorably correct various aberrations and especially distortion. Furthermore, this embodiment preferably performs best when all conditional expressions (6) through (10) are simultaneously satisfied.

In addition, at least one negative lens L54 of the fifth lens group G5 satisfies conditional expression (11). In this manner, the negative spherical aberration generated by the fifth lens group G5 is effectively corrected thereby making it possible to realize a high contrast image formation on the second object W.

The various values of the projection optical system that relate to the first embodiment are given in Table 1. In Table 1, DO is the distance on the optical axis from the reticle R (first object) to the lens plane of the extreme reticle R of the first lens group G1; and WD is the distance (working distance) on the optical axis from the lens plane of the extreme wafer W (second object) side of the fifth lens group G5; and the b is the projection magnification (lateral magnification) of the projection optical system; and the N.A. is the numerical aperture of the wafer W side of the projection optical system; and the φexp is the diameter of the exposure area (projection area) of the circle in the wafer W plane of the projection optical system; and the L is the distance on the optical axis between the images (i.e., between the reticle R and the wafer W). Further, in the lens data, the Number indicates order of the lens plane from the reticle R (first object); and the r indicates the curvature radius of said lens plane; and d indicates the spacing on the optical axis from said lens plane to the next lens plane; and the n indicates the glass material refractive index with respect to the i line ($\lambda$=365.015 nm); the φ indicates the clear aperture diameter of said lens plane. Moreover, the same reference codes are used to indicate the various values for all of the embodied examples to follow as in the present embodied example. The unit of measure for all examples used indicating the curvature radius r, the spacing on the optical axis d, and the clear aperture diameter φ that occur in the various values of each of the following embodied examples, can be expressed in mm.

Lens Data for Example 1

Parameters:

DO=109.413

WD=26.848

$\beta$=−0.250

N.A.=0.520

φexp=42.000

L=1250.000

F=939.165

TABLE 1

Lens data

| Number | R | d | n | φ | |
|---|---|---|---|---|---|
| 1 | 791.172 | 22.500 | 1.61265 | 198.4 | L11 |
| 2 | 273.340 | 2.002 | 1.00000 | 200.7 | |
| 3 | 281.205 | 39.197 | 1.46393 | 201.8 | L12 |
| 4 | −573.625 | 1.000 | 1.00000 | 203.6 | |
| 5 | 408.697 | 29.644 | 1.46393 | 205.2 | L13 |
| 6 | −1006.144 | 1.000 | 1.00000 | 203.9 | |
| 7 | 256.563 | 31.008 | 1.61548 | 197.0 | L14 |
| 8 | 353422.707 | 1.000 | 1.00000 | 191.6 | |
| 9 | 229.781 | 22.000 | 1.61548 | 176.5 | L21 |
| 10 | 126.728 | 20.093 | 1.00000 | 152.2 | |
| 11 | 427.536 | 16.970 | 1.61548 | 151.6 | L22 |
| 12 | 2267.800 | 1.000 | 1.00000 | 146.8 | |
| 13 | 1593.511 | 15.000 | 1.46393 | 145.9 | L23 |
| 14 | 132.558 | 19.701 | 1.00000 | 131.6 | |
| 15 | −2800.719 | 15.000 | 1.46393 | 131.3 | L24 |
| 16 | 175.474 | 23.961 | 1.00000 | 128.5 | |
| 17 | −206.113 | 21.550 | 1.46393 | 128.8 | L25 |
| 18 | 448.714 | 30.024 | 1.00000 | 142.2 | |
| 19 | −125.627 | 15.558 | 1.61265 | 143.6 | L26 |
| 20 | −1175.913 | 1.021 | 1.00000 | 176.8 | |
| 21 | −30644.154 | 43.644 | 1.46393 | 183.9 | L31 |
| 22 | −162.388 | 1.000 | 1.00000 | 194.9 | |
| 23 | −485.437 | 28.225 | 1.61548 | 211.7 | L32 |
| 24 | −224.099 | 1.000 | 1.00000 | 219.0 | |
| 25 | −52602.941 | 27.218 | 1.61548 | 230.0 | L33 |
| 26 | −430.357 | 1.000 | 1.00000 | 232.6 | |
| 27 | 590.071 | 26.973 | 1.61548 | 233.5 | L34 |
| 28 | −1690.697 | 1.000 | 1.00000 | 232.0 | |
| 29 | 193.801 | 40.140 | 1.61548 | 220.0 | L35 |
| 30 | 947.195 | 1.011 | 1.00000 | 211.8 | |
| 31 | 195.275 | 27.215 | 1.46393 | 191.4 | L36 |
| 32 | 415.942 | 4.998 | 1.00000 | 179.0 | |
| 33 | 630.902 | 20.876 | 1.61548 | 176.9 | L41 |
| 34 | 117.985 | 32.235 | 1.00000 | 142.1 | |
| 35 | −413.023 | 16.361 | 1.61265 | 140.7 | L42 |
| 36 | 225.000 | 31.048 | 1.00000 | 133.8 | |
| 37 | −142.680 | 15.191 | 1.61265 | 134.0 | L43 |
| 38 | −1025.728 | 46.006 | 1.00000 | 146.1 | |
| 39 | ∞ (flat plane) | 23.378 | 1.00000 | 172.1 | AS |
| 40 | −572.302 | 29.649 | 1.46393 | 185.4 | L51 |
| 41 | −211.448 | 1.002 | 1.00000 | 194.4 | |
| 42 | 2551.876 | 32.925 | 1.46393 | 214.4 | L52 |
| 43 | −322.186 | 1.000 | 1.00000 | 219.7 | |
| 44 | 455.025 | 37.078 | 1.61548 | 231.9 | L53 |
| 45 | −625.089 | 10.526 | 1.00000 | 232.0 | |
| 46 | −346.114 | 21.000 | 1.61265 | 231.7 | L54 |
| 47 | −892.299 | 3.534 | 1.00000 | 236.1 | |
| 48 | 340.241 | 42.451 | 1.46393 | 237.7 | L55 |
| 49 | −739.127 | 1.000 | 1.00000 | 235.4 | |
| 50 | 223.537 | 31.457 | 1.46393 | 217.7 | L56 |
| 51 | 687.322 | 1.000 | 1.00000 | 210.3 | |
| 52 | 161.128 | 34.948 | 1.46393 | 190.4 | L57 |
| 53 | 539.668 | 7.139 | 1.00000 | 179.0 | |
| 54 | 2184.705 | 17.000 | 1.61265 | 176.9 | L58 |
| 55 | 114.581 | 7.667 | 1.00000 | 143.9 | |
| 56 | 143.093 | 44.064 | 1.46393 | 143.3 | L59 |
| 57 | ∞ (flat plane) | 11.847 | 1.00000 | 127.8 | |
| 58 | 907.505 | 30.940 | 1.47458 | 114.6 | L510 |
| 59 | 106.724 | 3.066 | 1.00000 | 88.8 | |

TABLE 1-continued

Lens data

| Number | R | d | n | φ | |
|---|---|---|---|---|---|
| 60 | 77.523 | 26.699 | 1.46393 | 85.3 | L511 |
| 61 | 1684.716 | | | 74.2 | |

Values Corresponding to the Conditional Expressions:

t5'=101.703
t5=348.210
f1=208.285
f2=−51.068
f3=102.936
f4=−69.563
f5=152.375
L=1250.000
φ5n=236.1
φ5max=237.7

$\phi/\phi exp=3.41$ (L59), 2.73 (L510), 2.03 (L511)  (1)

n=1.46363 (L59), 1.47458 (L510), 1.46363 (L511)  (2)

$\phi/\phi exp=5.56$ (φ: Surface No. 27 of L34)  (3)

n=1.61548  (4)

$t5'/t5=0.292$ ($t5'=L59+L510+L511$, $t5=L51+L52+\ldots+L511$)  (5)

f1/L=0.167  (6)

−f2/L=0.041  (7)

f3/L=0.082  (8)

−f4/L=0.056  (9)

f5/L=0.122  (10)

φ5n/φ5max=0.98 (φ5n: Surface No. 46 of L54, φ5max: Surface No. 48 of L55)  (11)

f/L=0.751  (12)

Figure 3:
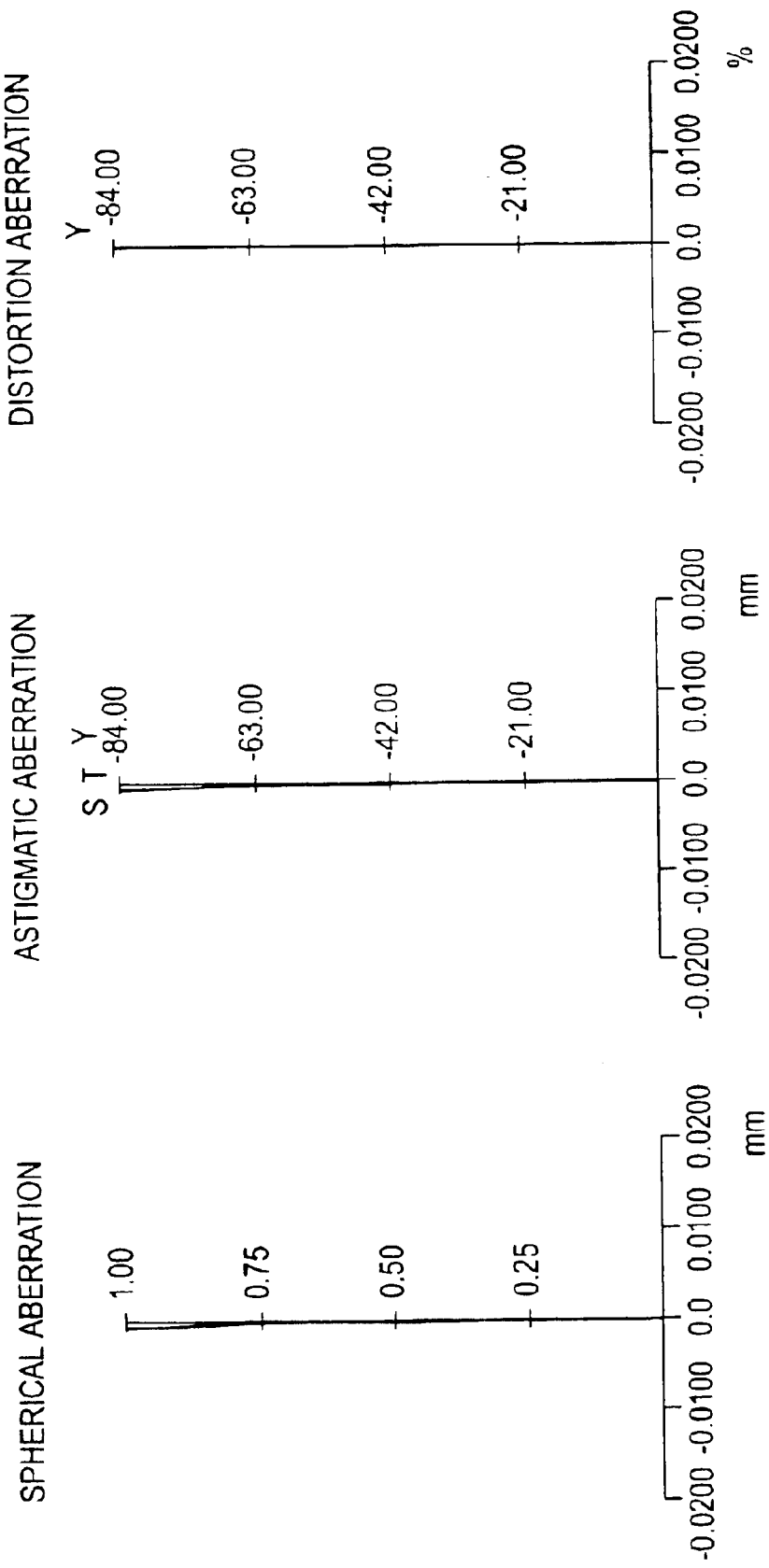
FIG. 3 illustrates the longitudinal aberration of the projection optical system that relates to the first embodiment of the present invention.
Figure 4:
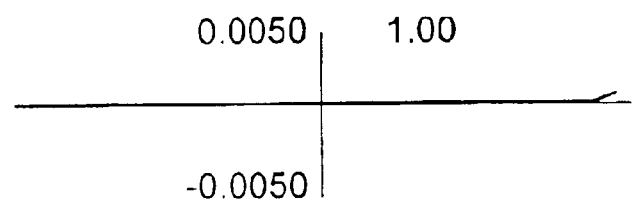
FIG. 4 illustrates the lateral aberration of the projection optical system that relates to the first embodiment of the present invention.
Figure 4:
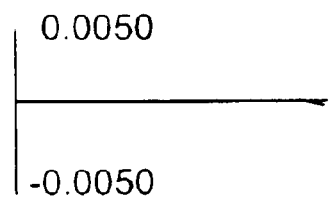
Figure 4:
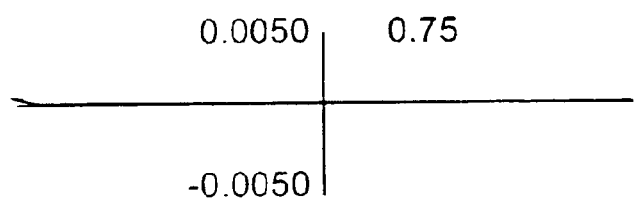
Figure 4:
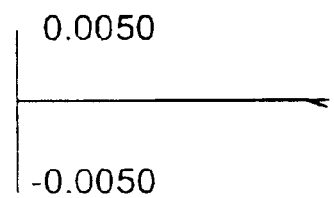
Figure 4:
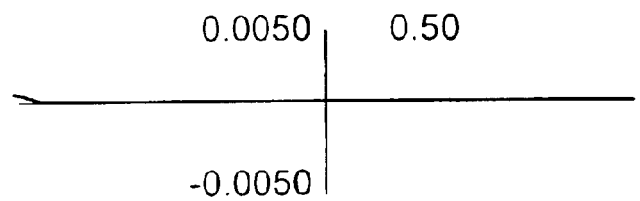
Figure 4:
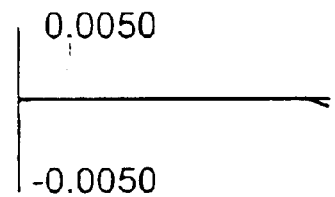
Figure 4:
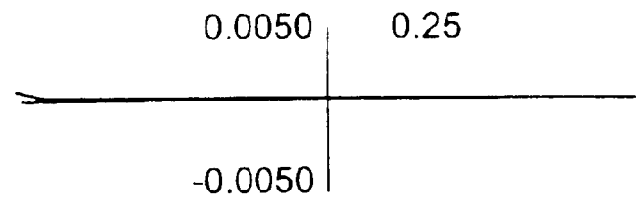
Figure 4:
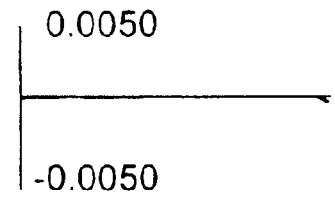
Figure 4:
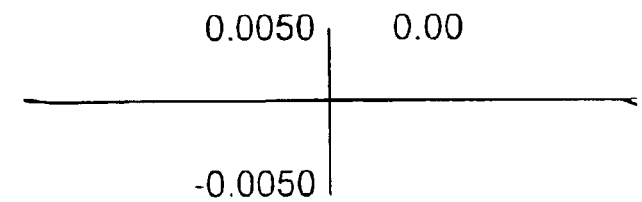
Figure 4:
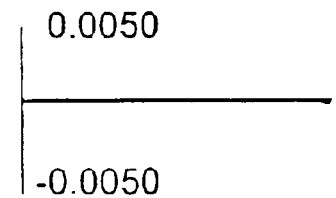

FIG. 3 shows the longitudinal aberration of the projection optical system of the present embodiment, and FIG. 4 shows the lateral aberrations (coma aberration) occurring in the meridional (tangential) direction and the sagittal direction. In each of the aberration figures, the N.A. is the numerical aperture of the wafer W side of the projection optical system; and the Y is the image height of the wafer W side. In the astigmatic aberration figures, the dotted line indicates the tangential image plane and the solid line indicates the sagittal image plane. Furthermore, the same reference codes are used for all the various aberration figures of the embodied examples that follow as in the present embodied example. As is evident from the various aberration figures, the projection optical system of the present embodiment, in addition to suppressing the reduction of the image formation performance due to the absorption by the glass material used and favorably correcting in particularly the distortion in all of the broad exposure areas regardless of being both-side telecentric, it can be seen that the other aberrations are corrected in similar balance.

II. PREFERRED EMBODIMENT EXAMPLE 2

Figure 5:
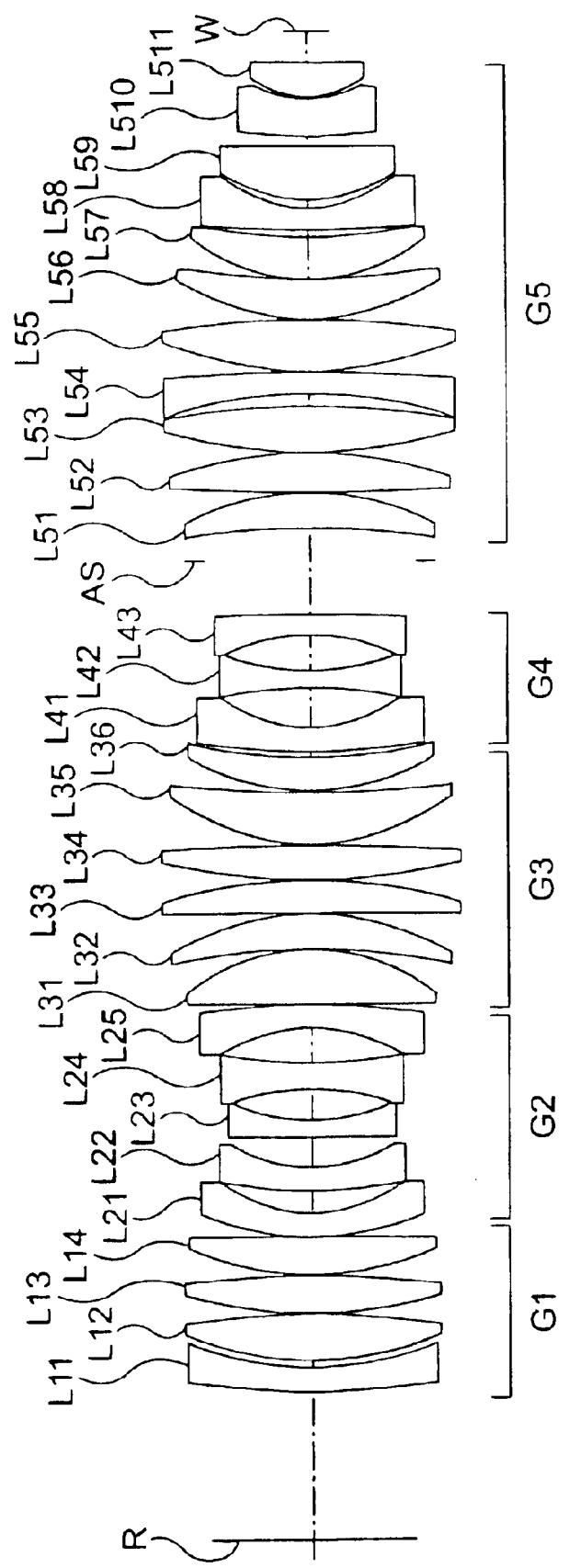
FIG. 5 illustrates the lens sectional view of the projection optical system that relates to the second embodiment of the present invention.

FIG. 5 is a drawing that shows the lens construction of the projection optical system that relates to the second embodiment. It has, in order from the reticle R (object plane) as the first object, a first lens group G1 having a positive refractive power and with at least one negative lens L11; and a second lens group G2 having a negative refractive power; and a third lens group G3 having a positive refractive power; and a fourth lens group G4 having a negative refractive power; and a fifth lens group G5 having a positive refractive power with at least two negative lenses L54 and L58. Furthermore, it is both-sidedly telecentric on the wafer W (image plane) side for the second object and the reticle R (object plane) side.

Further, the lens L59, L510, L511 are comprised so as to satisfy the conditional expressions (1) and (2). In this manner, a higher transmission factor can be secured in a lens with a high energy density of the exposure light thereby making it possible to suppress the reduction of the image formation performance that occurs due to the reduction of the transmission factor.

In addition, this embodiment preferably employs one or more lenses having a lens L34 that satisfies conditional expressions (3) and (4). In this manner, a higher refractive index can be secured in a lens composition with comparatively low energy density for the exposure light thereby making favorable aberration correction possible and realizing a compact optical system.

Further, the lens L59, L510, L511 are comprised so as to satisfy the conditional expression (5). In this manner, a higher transmission factor can be secured in a lens with a high energy density of the exposure light thereby making it possible to suppress the reduction of the image formation performance that occurs due to the reduction of the transmission factor.

Moreover, the focal distance between each of the lens groups G1 through G5 is composed so as to satisfy the conditional expressions (6) through (10). In this manner, while being both-side telecentric and securing a sufficiently high numerical aperture and broad exposure area, it realizes a high performance yet compact projection optical system which has the ability to very favorably correct various aberrations and especially distortion. Furthermore, it is best when all conditional expressions (6) through (10) are simultaneously satisfied.

In addition, at least one negative lens L54 in the fifth lens group G5 is composed so as to satisfy conditional expression (11). Accordingly, the negative spherical aberration generated by the fifth lens group G5 is effectively corrected thereby making it possible to realize a high contrast image formation on the second object W.

In Table 2, the various values of the projection optical system that relate to the second embodiment are illustrated.

Lens Data for Example 2

Parameters:

D0=118.644
WD=25.189
β=−0.250
N.A.=0.520
φexp=42.000
L=1250.000
F=939.108

TABLE 2

Lens Data

| Number | R | d | n | φ | |
|---|---|---|---|---|---|
| 1 | 941.026 | 22.500 | 1.61265 | 200.6 | L11 |
| 2 | 272.099 | 3.595 | 1.00000 | 203.6 | |
| 3 | 284.530 | 40.119 | 1.61548 | 205.8 | L12 |
| 4 | −566.773 | 1.000 | 1.00000 | 206.8 | |
| 5 | 360.087 | 28.872 | 1.46393 | 204.7 | L13 |
| 6 | −1929.907 | 1.000 | 1.00000 | 202.0 | |
| 7 | 238.718 | 30.104 | 1.46393 | 192.3 | L14 |
| 8 | 2940.465 | 1.000 | 1.00000 | 186.0 | |
| 9 | 204.278 | 22.000 | 1.61548 | 171.2 | L21 |
| 10 | 120.726 | 17.690 | 1.00000 | 147.2 | |
| 11 | 309.472 | 20.146 | 1.61548 | 146.4 | L22 |
| 12 | 137.672 | 20.805 | 1.00000 | 132.6 | |
| 13 | 11217.354 | 18.110 | 1.46393 | 132.1 | L23 |
| 14 | 177.433 | 25.429 | 1.00000 | 129.2 | |
| 15 | −208.043 | 21.550 | 1.46393 | 129.8 | L24 |
| 16 | 431.365 | 30.552 | 1.00000 | 143.5 | |
| 17 | −124.350 | 15.425 | 1.61265 | 144.5 | L25 |
| 18 | −1043.973 | 2.023 | 1.00000 | 178.4 | |
| 19 | −9400.162 | 44.515 | 1.46393 | 187.6 | L31 |
| 20 | −163.499 | 1.973 | 1.00000 | 198.9 | |
| 21 | −504.731 | 29.105 | 1.61548 | 217.5 | L32 |
| 22 | −228.074 | 1.000 | 1.00000 | 224.8 | |
| 23 | −43550.511 | 28.097 | 1.61548 | 236.3 | L33 |
| 24 | −429.738 | 1.000 | 1.00000 | 238.9 | |
| 25 | 523.375 | 28.582 | 1.61548 | 239.6 | L34 |
| 26 | −2096.842 | 1.000 | 1.00000 | 237.7 | |
| 27 | 192.750 | 40.981 | 1.61548 | 224.0 | L35 |
| 28 | 918.472 | 2.700 | 1.00000 | 215.7 | |
| 29 | 198.092 | 27.472 | 1.46393 | 192.7 | L36 |
| 30 | 424.625 | 5.627 | 1.00000 | 179.6 | |
| 31 | 720.205 | 20.495 | 1.61548 | 177.4 | L41 |
| 32 | 115.447 | 32.914 | 1.00000 | 141.3 | |
| 33 | −432.333 | 16.404 | 1.61265 | 139.4 | L42 |
| 34 | 225.000 | 26.952 | 1.00000 | 132.3 | |
| 35 | −147.283 | 17.480 | 1.61265 | 132.3 | L43 |
| 36 | −1349.913 | 43.313 | 1.00000 | 144.1 | |
| 37 | ∞ (flat plane) | 25.663 | 1.00000 | 166.6 | AS |
| 38 | −568.842 | 31.885 | 1.46393 | 181.5 | L51 |
| 39 | −206.204 | 1.000 | 1.00000 | 192.1 | |
| 40 | 1210.297 | 32.850 | 1.46393 | 213.5 | L52 |
| 41 | −360.352 | 1.000 | 1.00000 | 218.1 | |
| 42 | 403.190 | 37.256 | 1.61548 | 229.0 | L53 |
| 43 | −694.368 | 10.901 | 1.00000 | 228.6 | |
| 44 | −352.861 | 21.000 | 1.61265 | 228.2 | L54 |
| 45 | −1232.232 | 1.000 | 1.00000 | 231.5 | |
| 46 | 372.482 | 40.567 | 1.46393 | 232.5 | L55 |
| 47 | −619.531 | 1.000 | 1.00000 | 230.5 | |
| 48 | 210.349 | 31.297 | 1.46393 | 212.0 | L56 |
| 49 | 610.517 | 1.000 | 1.00000 | 204.5 | |
| 50 | 155.645 | 34.480 | 1.46393 | 185.3 | L57 |
| 51 | 516.374 | 7.004 | 1.00000 | 173.8 | |
| 52 | 2022.223 | 17.000 | 1.61265 | 171.7 | L58 |
| 53 | 111.072 | 7.677 | 1.00000 | 139.2 | |
| 54 | 140.438 | 42.404 | 1.46393 | 138.6 | L59 |
| 55 | ∞ (flat plane) | 10.415 | 1.00000 | 123.5 | |
| 56 | 1005.087 | 28.938 | 1.47458 | 111.9 | L510 |
| 57 | 104.792 | 2.188 | 1.00000 | 87.4 | |
| 58 | 76.550 | 28.113 | 1.46393 | 84.5 | L511 |
| 59 | 1934.993 | | | 72.3 | |

Values Corresponding to the Conditional Expressions:

$t5'=99.455$
$t5=345.789$
$f1=208.899$
$f2=-51.041$
$f3=103.734$
$f4=-68.649$
$f5=148.341$
$L=1250.000$
$\phi 5n=231.5$
$\phi 5max=232.5$
$F=939.165$ $$\phi/\phi exp=3.3 \ (L59),\ 2.66\ (L510),\ 2.01\ (L511) \qquad (1)$$

$$n=1.46393\ (L59),\ 1.47458\ (L510),\ 1.46393\ (L511) \qquad (2)$$

$$\phi/\phi exp=5.70\ (\phi:\text{ Surface No. }25\text{ of }L34) \qquad (3)$$

$$n=1.61548 \qquad (4)$$

$$t5'/t5=0.288\ (t5'=L59+L510+L511,\ t5=L51+L52+\ldots+L511) \qquad (5)$$

$$f1/L=0.167 \qquad (6)$$

$$-f2/L=0.041 \qquad (7)$$

$$f3/\text{i }L=0.083 \qquad (8)$$

$$-f4/L=0.055 \qquad (9)$$

$$f5/L=0.119 \qquad (10)$$

$$\phi 5n/\phi 5max=0.98\ (\phi 5n:\text{ Surface No. }44\text{ of }L54,\ \phi 5max:\text{ Surface No. }46\text{ of }L55) \qquad (11)$$

$$f/L=0.751 \qquad (12)$$

Figure 6:
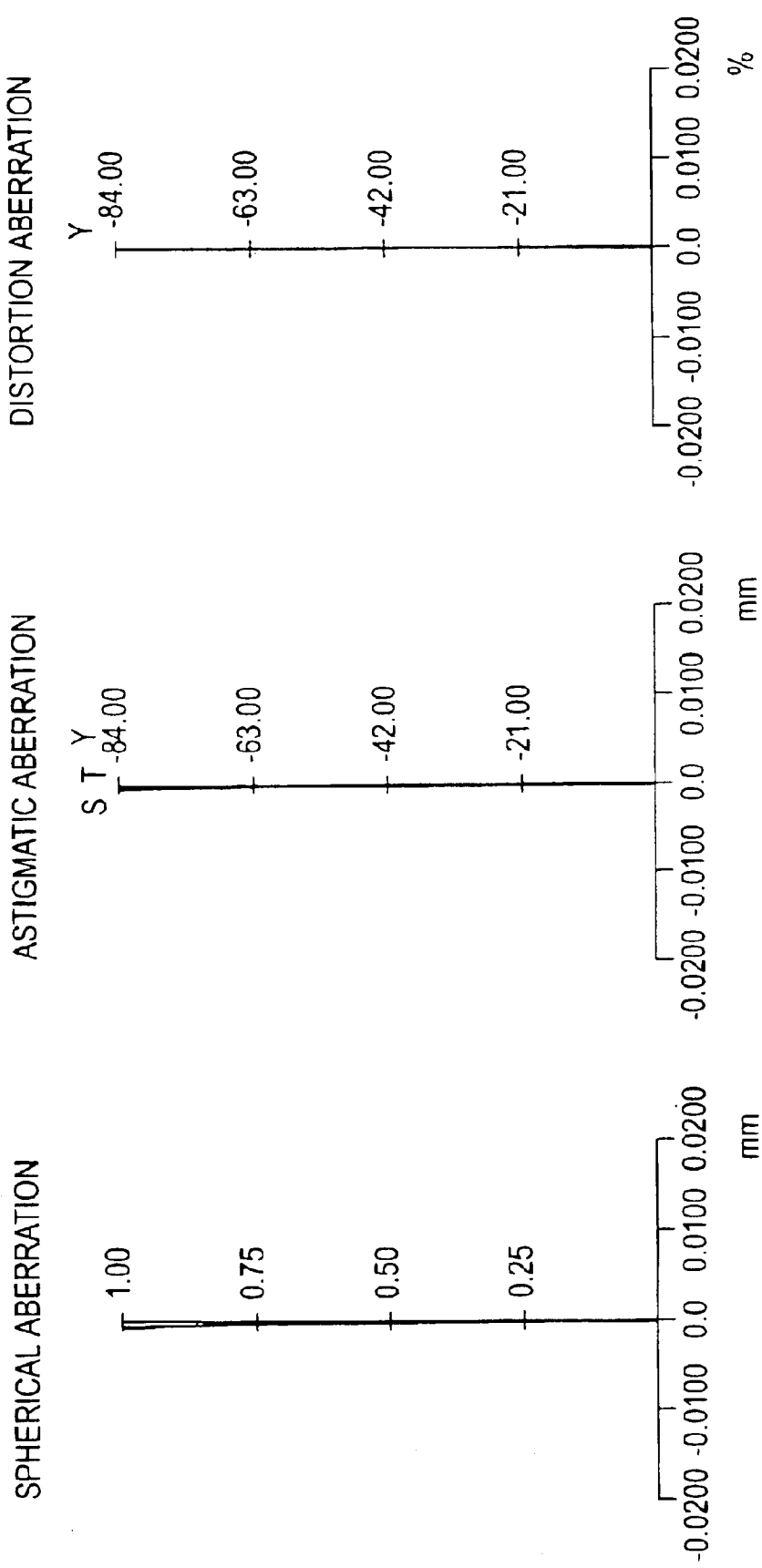
FIG. 6 illustrates the longitudinal aberration of the projection optical system that relates to the second embodiment of the present invention.
Figure 7:
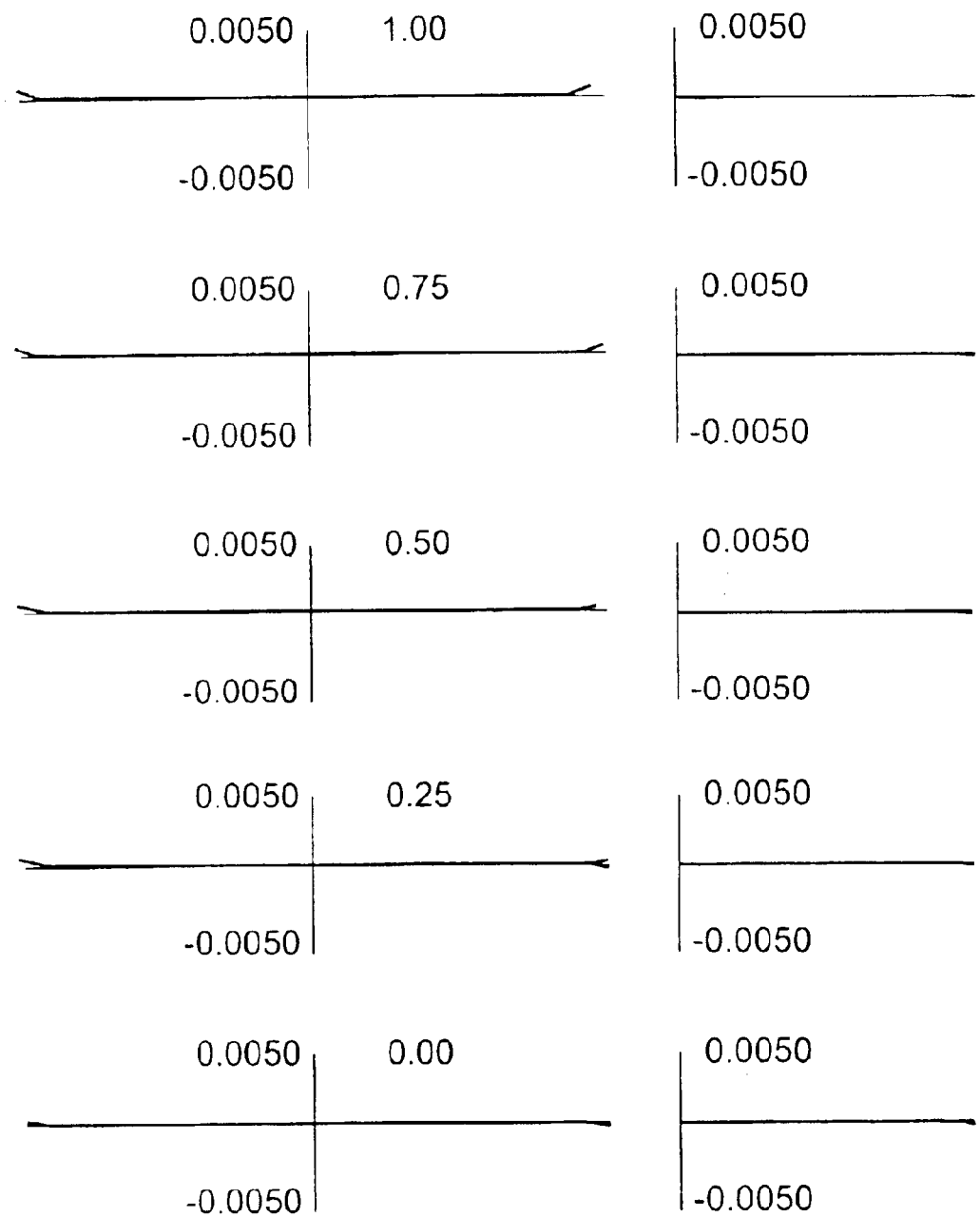
FIG. 7 illustrates the lateral aberration of the projection optical system that relates to the second embodiment of the present invention.

FIGS. 6 and 7 illustrate the various aberrations of the projection optical system that relate to the present embodiment. As is evident from the figures, in addition to suppressing the reduction of the image formation performance due to the absorption by the glass material used and favorably correcting in particularly the distortion in all of the broad exposure areas regardless of being both-sidedly telecentric, it can be seen that the other aberrations are corrected in similar balanced manner.

III. PREFERRED EMBODIMENT EXAMPLE 3

Figure 8:
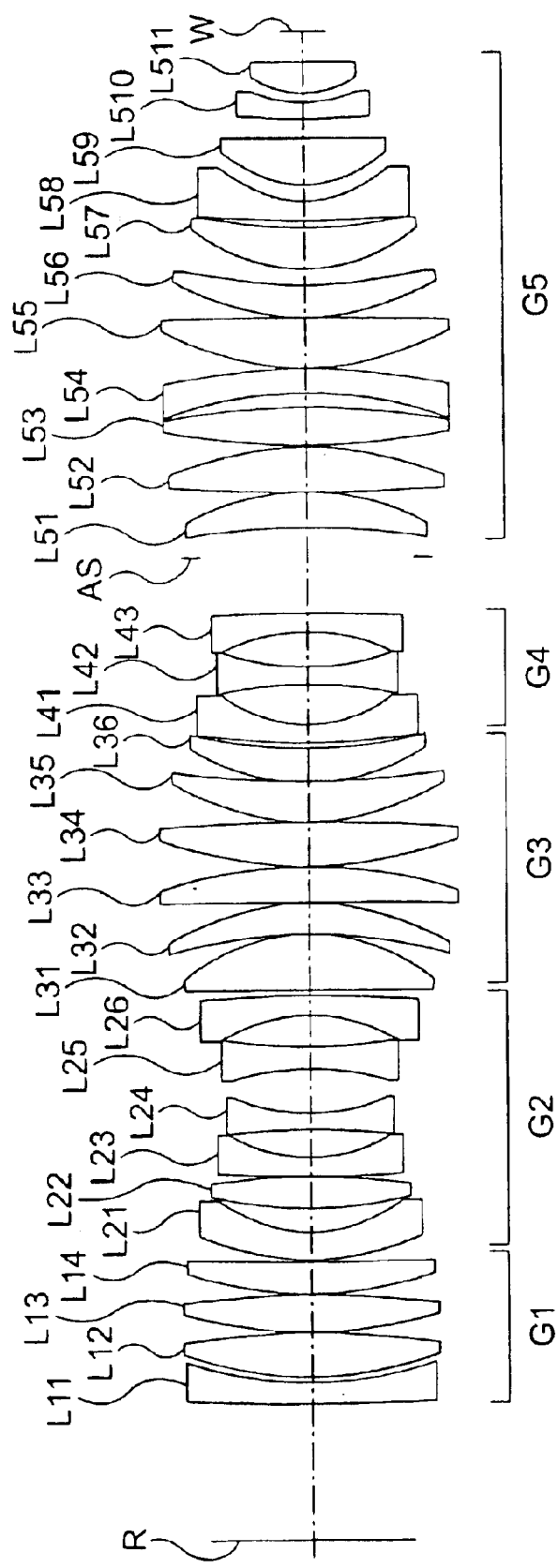
FIG. 8 illustrates the lens sectional view of the projection optical system that relates to the third embodiment of the present invention.

FIG. 8 shows the lens construction of the projection optical system that relates to a third embodiment of the present invention. It has, in order from the reticle R (object plane) as the first object, a first lens group G1 having a positive refractive power and with at least one negative lens L11; and a second lens group G2 having a negative refractive power; and a third lens group G3 having a positive refractive power; and a fourth lens group G4 having a negative refractive power; and a fifth lens group G5 having a positive refractive power with at least two negative lenses L54 and L58. Furthermore, it is both-sidedly telecentric on the wafer W (image plane) side for the second object and the reticle R (object plane) side.

Further, the lens L59, L510, L511 is comprised so as to satisfy the conditional expressions (1) and (2). In this manner, a higher transmission factor can be secured in a lens with a high energy density of the exposure light thereby making it possible to suppress the reduction of the image formation performance that occurs due to the reduction of the transmission factor.

In addition, this embodiment preferably employs one or more lenses having a lens L34 that satisfies conditional expressions (3) and (4). In this manner, a higher refractive index can be secured in a lens with comparatively low energy density of the exposure light thereby making favorable aberration correction possible and realizing a compact optical system.

Further, the lens L59, L510, L511 is comprised so as to satisfy the conditional expression (5). In this manner, a higher transmission factor can be secured in a lens with a high energy density of the exposure light thereby making it possible to suppress the reduction of the image formation performance that occurs due to the reduction of the transmission factor.

Moreover, the focal distance between each of the lens groups G1 through G5 is composed so as to satisfy the conditional expressions (6) through (10). In this manner, while being both-sidedly telecentric and securing a sufficiently high numerical aperture and broad exposure area, this embodiment realizes a high performance yet compact projection optical system which has the ability to very favorably correct various aberrations and especially distortion. Furthermore, it is best when all conditional expressions (6) through (10) are simultaneously satisfied.

In addition, at least one negative lens L54 in the fifth lens group G5 is composed so as to satisfy conditional expression (11). Accordingly, the negative spherical aberration generated by the fifth lens group G5 is effectively corrected thereby making it possible to realize a high contrast image formation on the second object W.

The various values of the projection optical system that relate to the third embodiment are provided in Table 3.

Lens Data For Example 3

Parameters:

DO=108.671

WD=25.136

β=−0.250

N.A.=0.520

φexp=42.000

L=1250.000

F=900.281

TABLE 3

Lens Data

| Number | R | d | n | φ | |
|---|---|---|---|---|---|
| 1 | 2014.189 | 18.000 | 1.61265 | 197.2 | L11 |
| 2 | 296.824 | 5.634 | 1.00000 | 201.4 | |
| 3 | 317.104 | 37.032 | 1.46393 | 205.1 | L12 |
| 4 | −628.560 | 1.000 | 1.00000 | 207.6 | |
| 5 | 484.710 | 28.619 | 1.61548 | 211.5 | L13 |
| 6 | −998.956 | 1.000 | 1.00000 | 210.8 | |
| 7 | 283.130 | 29.908 | 1.61548 | 204.8 | L14 |
| 8 | 7410.218 | 1.000 | 1.00000 | 199.8 | |
| 9 | 233.039 | 22.251 | 1.61265 | 185.9 | L21 |
| 10 | 136.798 | 20.152 | 1.00000 | 163.0 | |
| 11 | 393.096 | 24.589 | 1.61548 | 162.3 | L22 |
| 12 | −774.973 | 1.000 | 1.00000 | 157.5 | |
| 13 | 5200.000 | 15.000 | 1.46393 | 152.8 | L23 |
| 14 | 129.927 | 23.576 | 1.00000 | 134.4 | |
| 15 | −729.461 | 15.068 | 1.46393 | 133.9 | L24 |
| 16 | 194.388 | 36.002 | 1.00000 | 130.1 | |
| 17 | −219.245 | 15.371 | 1.46393 | 132.2 | L25 |
| 18 | 385.617 | 30.884 | 1.00000 | 141.6 | |
| 19 | −123.476 | 15.000 | 1.61265 | 142.6 | L26 |
| 20 | −2462.517 | 4.749 | 1.00000 | 175.6 | |
| 21 | 72079.272 | 44.358 | 1.46393 | 186.3 | L31 |
| 22 | −164.365 | 1.040 | 1.00000 | 197.4 | |
| 23 | −430.639 | 26.909 | 1.61548 | 213.2 | L32 |
| 24 | −227.560 | 1.000 | 1.00000 | 221.0 | |
| 25 | −107138.971 | 28.305 | 1.61548 | 233.2 | L33 |
| 26 | −417.327 | 1.000 | 1.00000 | 236.1 | |
| 27 | 318.244 | 36.396 | 1.61548 | 238.2 | L34 |
| 28 | −5130.548 | 1.252 | 1.00000 | 235.0 | |
| 29 | 217.233 | 34.322 | 1.61548 | 219.6 | L35 |
| 30 | 800.147 | 1.027 | 1.00000 | 211.3 | |
| 31 | 198.579 | 25.327 | 1.46393 | 191.6 | L36 |
| 32 | 365.795 | 5.187 | 1.00000 | 178.9 | |
| 33 | 495.017 | 16.558 | 1.61548 | 176.2 | L41 |
| 34 | 123.560 | 31.738 | 1.00000 | 145.7 | |

TABLE 3-continued

Lens Data

| Number | R | d | n | φ | |
|---|---|---|---|---|---|
| 35 | −408.905 | 15.466 | 1.61265 | 144.7 | L42 |
| 36 | 223.379 | 29.466 | 1.00000 | 136.7 | |
| 37 | −144.209 | 15.023 | 1.61265 | 136.7 | L43 |
| 38 | −1282.715 | 45.782 | 1.00000 | 148.4 | |
| 39 | ∞ (flat plane) | 23.833 | 1.00000 | 172.9 | AS |
| 40 | −648.777 | 28.616 | 1.46393 | 186.8 | L51 |
| 41 | −213.845 | 1.095 | 1.00000 | 194.5 | |
| 42 | 1004.569 | 37.827 | 1.46393 | 215.1 | L52 |
| 43 | −306.465 | 2.196 | 1.00000 | 219.7 | |
| 44 | 546.948 | 30.975 | 1.61548 | 227.6 | L53 |
| 45 | −836.559 | 13.854 | 1.00000 | 227.3 | |
| 46 | −331.552 | 18.523 | 1.61265 | 227.0 | L54 |
| 47 | −640.300 | 1.000 | 1.00000 | 231.1 | |
| 48 | 253.111 | 41.066 | 1.46393 | 231.7 | L55 |
| 49 | −3935.806 | 1.000 | 1.00000 | 228.2 | |
| 50 | 231.463 | 26.916 | 1.46393 | 214.2 | L56 |
| 51 | 463.993 | 12.973 | 1.00000 | 206.1 | |
| 52 | 157.799 | 34.930 | 1.46393 | 183.1 | L57 |
| 53 | 616.457 | 5.379 | 1.00000 | 172.0 | |
| 54 | 1269.284 | 15.127 | 1.61265 | 169.1 | L58 |
| 55 | 100.172 | 13.803 | 1.00000 | 137.3 | |
| 56 | 104.074 | 37.360 | 1.46393 | 134.4 | L59 |
| 57 | ∞ (flat plane) | 16.576 | 1.00000 | 125.9 | |
| 58 | 704.105 | 15.290 | 1.46393 | 106.5 | L510 |
| 59 | 129.344 | 5.677 | 1.00000 | 90.8 | |
| 60 | 85.802 | 26.186 | 1.46393 | 84.6 | L511 |
| 61 | 359.698 | | | 70.5 | |

Values Corresponding to the Conditional Expressions:

t5'=78.835 t5=312.789 f1=226.531 f2=−53.700 f3=104.222 f4=−72.830 f5=153.351

L=1250.000

φ5n=231.1

φ5max=231.7

F=939.165

$$\varphi/\varphi exp=3.2\ (L59),\ 2.54\ (L510),\ 2.01\ (L511) \quad (1)$$

$$n=1.46393\ (L59),\ 1.46393\ (L510),\ 1.46393\ (L511) \quad (2)$$

$$\varphi/\varphi exp=5.67\ (\varphi:\ \text{Surface No. 27 of L34}) \quad (3)$$

$$n=1.61548 \quad (4)$$

$$t5'/t5=0.252\ (t5'=L59+L510+L511,\ t5=L51+L52+\ldots+L511) \quad (5)$$

$$f1/L=0.181 \quad (6)$$

$$-f2/L=0.043 \quad (7)$$

$$f3/L=0.083 \quad (8)$$

$$-f4/L=0.058 \quad (9)$$

$$f5/L=0.123 \quad (10)$$

$$\varphi 5n/\varphi 5max=0.98\ (\varphi 5n:\ \text{Surface No. 46 of L54},\ (\varphi 5max:\ \text{Surface No. 48 of L55}) \quad (11)$$

$$f/L=0.751 \quad (12)$$

Figure 9:
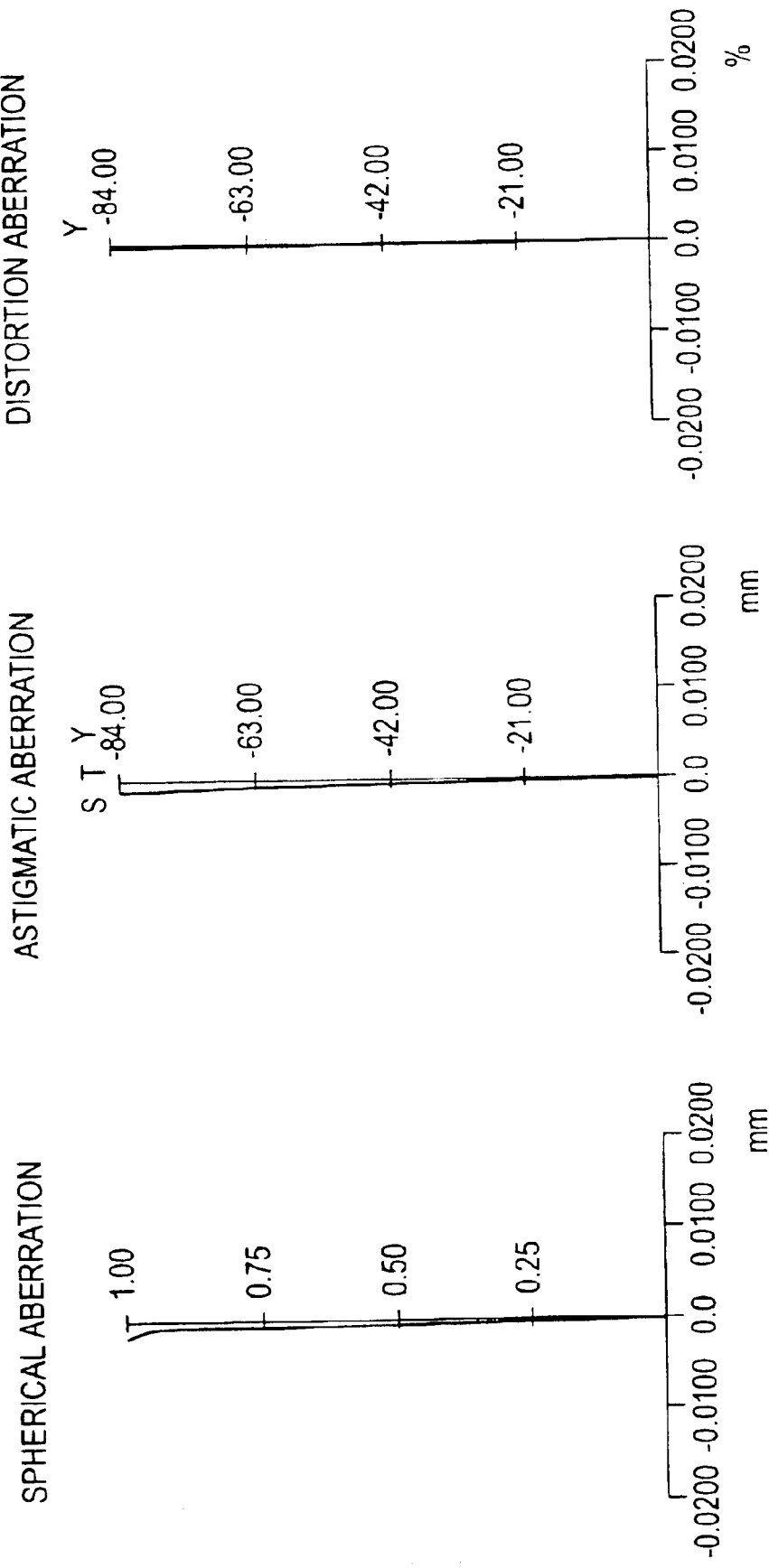
FIG. 9 illustrates the longitudinal aberration of the projection optical system that relates to the third embodiment of the present invention.
Figure 10:
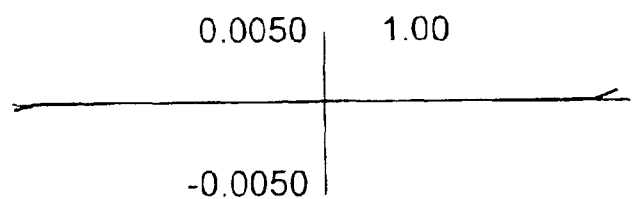
FIG. 10 is a drawing that shows the lateral aberration of the projection optical system that relates to the third embodiment of the present invention.
Figure 10:
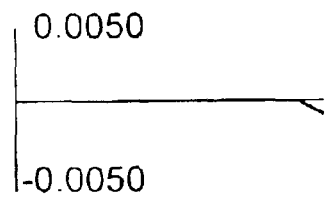
Figure 10:
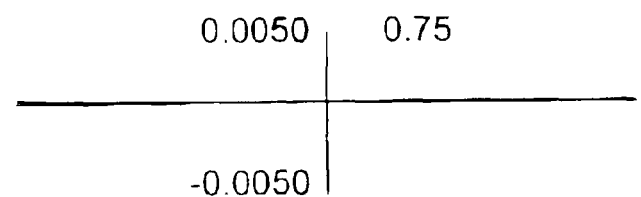
Figure 10:
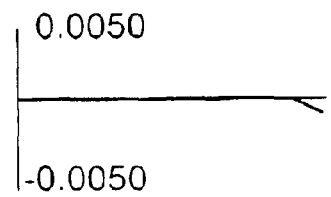
Figure 10:
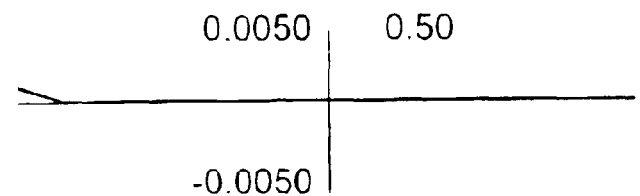
Figure 10:
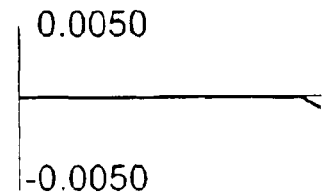
Figure 10:
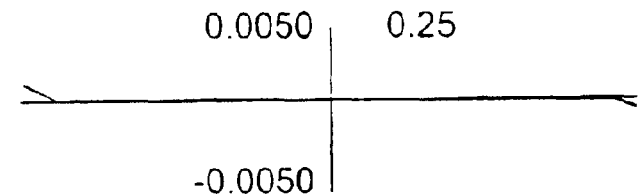
Figure 10:
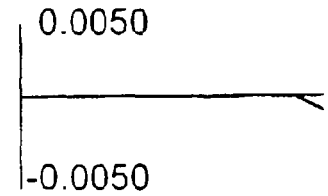
Figure 10:
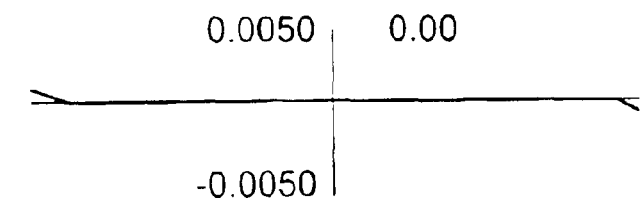
Figure 10:
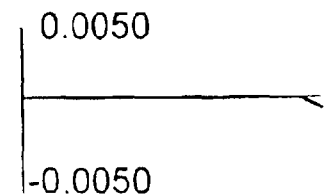

FIGS. 9 and 10 are drawings showing the various aberrations of the present embodiment. As is evident from the figures, the projection optical system of the present embodiment, in addition to suppressing the reduction of the image formation performance due to the absorption by the glass material used and favorably correcting in particularly the distortion in all of the broad exposure areas regardless of being both-sided telecentric, it can be seen that the other aberrations are corrected in similar balance.

Moreover, in each of the above embodied examples, although an ultra-high pressure mercury vapor lamp that supplies a light that includes an i line ($\lambda=365$ nm) was applied as the light source, a discharge lamp supplying light that includes a g line ($\lambda=436$ nm) and an h line ($\lambda=404$ nm), and a laser beam that supplies light of a deep ultraviolet (far-ultraviolet) region and a vacuum ultraviolet region can also be applied as the light source L. When using a laser light source as the light source, a beam attenuator for control an exposure dose and a beam shaping optical system for forming a predetermined size and shape of the beam cross-section of the laser beam from the light source L, are to be arranged in the illumination system. Further, when the light source L is arranged separately from the projection exposure apparatus body, it is best to arrange an automatic beam steering unit which always faces the direction of the light from the light source L towards the projection exposure apparatus body side.

When using a light source that supplies an exposure light of a DUV (Deep UltraViolet) region and a VUV (Vacuum UltraViolet) region, it is best if the optical path between the light source L and the illumination system IS is sealed with a casing, and the air space from the light source L to the optical member parts of the extreme reticle side of the illumination system IS is replaced with an inert gas such as noble (rare) gas (e.g., helium gas, nitrogen gas) being a gas with a low absorption ratio for exposure light. At this time, the interior of the projection optical system PL is comprised so as to be maintain a sealed condition between the optical member parts that are arranged to the extreme wafer side and the optical member parts that are arranged on the extreme reticle side from among the optical member parts comprising the projection optical system; and it is best when the gas on the inside of the projection optical system PL is replaced with an inert gas such as noble (rare) gas (e.g., helium, nitrogen gas).

Furthermore, with the form of the embodiment described above, the case is described where the rectangular shaped area (for example 26 mm×33 mm) inscribed within the circle having a diameter of ϕmax undergoes exposure at once as the exposure area, and the rectangular shaped area inscribed within the circle has the shape of a slit or a slot whereby scan-exposure can be performed when starting the movement of the reticle R and the wafer W. In this case, the exposure light is supplied against the rectangular shaped (slit shaped) area (illumination area) having a short border along the X direction and a long border along the Y direction from among all the pattern areas on the reticle R, and by causing the reticle stage RS and the wafer stage WS, or the reticle R and the wafer W, to move (scan) synchronously in the X direction according to the speed ratio that corresponds to the magnification of the projection optical system PL, the mask pattern is swept and undergoes exposure against the area (shot area) having the length that corresponds to the scan amount (movement amount) of the wafer W as well as having a width that is equal to the long border of the exposure area on wafer W.

In addition, with each embodiment described above, the lens surfaces of each lens in the projection optical system PL are all spherically shaped, however, one or more lens surfaces may have an aspherical (non-spherical) shape in order to achieve at least one objective by further increasing the exposure area of the projection optical system PL and further increasing the numerical aperture of the projection optical system PL.

IV. PREFERRED EMBODIMENT EXAMPLE 4

Figure 11:
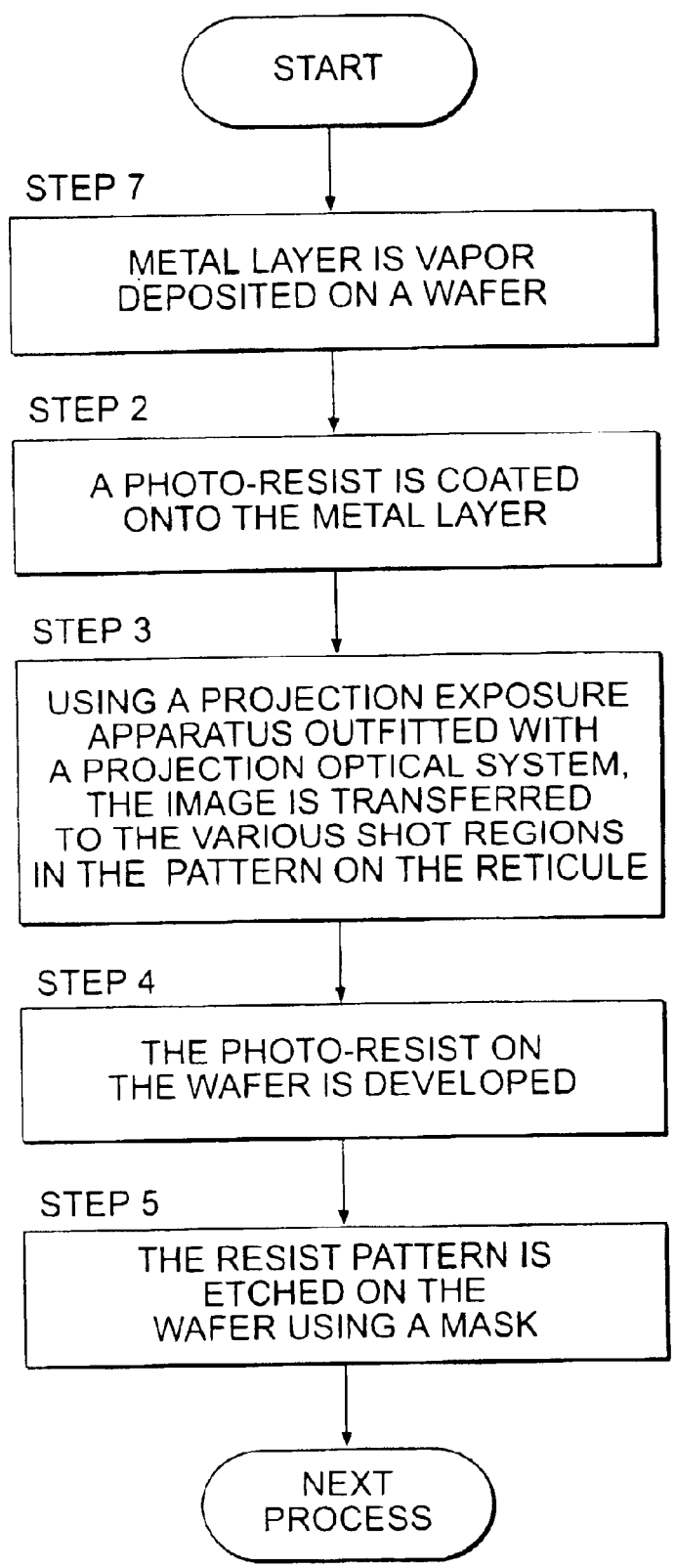
FIG. 11 is a flow diagram illustrating the semiconductor device manufacturing method that employs the projection optical system involved with the embodiments of the present invention.

FIG. 11 is a flow chart of the semiconductor device manufacturing method comprising a predetermined circuit pattern on a wafer by using the exposure apparatus that provides the projection optical system of each of the embodiments described above.

In Step 1, a metal film is vapor deposited on one lot of wafers. In the subsequent Step 2, a photoresist is applied to the metal film on the one lot of wafers. Thereafter, in Step 3, the image of the pattern on the reticle R is sequentially exposed and transferred, through the projection optical system thereof, to each shot area on the one lot of wafers by using the projection exposure apparatus of FIG. 1 that provides the projection optical system of the embodiment described above. Thereafter, in Step 4, after the developing of the photoresist on the one lot of wafers, in Step 5, by etching the resist pattern on the one lot of wafers as a mask, the circuit pattern that corresponds to the pattern on the reticle R is formed in each shot area on each wafer. Thereafter, by forming the circuit pattern on a further layer, the device of the semiconductor element is manufactured.

As described above, the projection optical system of each of the embodiments, while being both-sidedly telecentric, and in addition to suppressing the reduction of the image formation performance that occurs due to the absorption by the glass material used, and on account of increasing the numerical aperture N.A., and even when there is a bend in the reticle R and a bend on each wafer of the exposure subject, a refined circuit pattern can be formed with stability and with a high resolution on each wafer. Furthermore, since the exposure area of the projection optical system is broad, a large device with a high throughput can be manufactured.

Further, the present invention can be applied to both the Step and Repeat method (batch exposure method) which, after transferring at once the mask pattern image to one shot area on the wafer repeats the process where the wafers within the plane that is orthogonal to the optical axis of the projection optical system are consecutively and two dimensionally moved, then the mask pattern image is transferred in one batch to the next shot area, and the Step and Scan method (scan-exposure method) which performs synchronous scanning of the mask and wafer, with a projection magnification b against the projection optical system as a speed ratio, at the time of exposure to each shot area of the wafer. Moreover, since the Step and Scan method is best provided the favorable image formation performance can be attained within the exposure area of the slit shape (thin, long shape), exposure to a broader shot area on the wafer becomes possible without enlarging the projection optical system.

V. PREFERRED EMBODIMENT EXAMPLE 5

In the photolithography process for manufacturing a semiconductor element device or so forth, a reduction projection exposure apparatus (stepper, scanner, or so forth) is used. In general, a semiconductor element device such as an ultra LSI is formed by over-laying multiple layers on to a wafer, however, of those layers, the layer requiring the highest resolution is called the critical layer. In contrast to this, the layers that do not require a high resolution, such as the ion implant layers that are used when manufacturing, for example, semiconductor memory, are called the middle layers. For example, in recent manufacturing factories of ultra LSI, it is becoming more common to distinguish between different exposure devices when performing exposure between different layers within the manufacturing process of a single type of ultra LSI. Therefore, when manufacturing ultra LSI having both a critical layer and a middle layer, it is common to perform exposure using a so-called Mix-and-Match method where the exposure of the critical layer is performed with a projection exposure apparatus having a high resolution, and the exposure of the middle layer is performed by a projection exposure apparatus of a relatively rougher resolution.

Hereafter, an explanation will be provided of the exposure method that uses the scanning type projection exposure apparatus (the projection exposure apparatus of the Step and Scan method) which has a high resolution to the exposure of the critical layer, and the exposure method that uses the batch exposure type projection exposure apparatus (stepper) for exposure to the middle layer.

Figure 12:
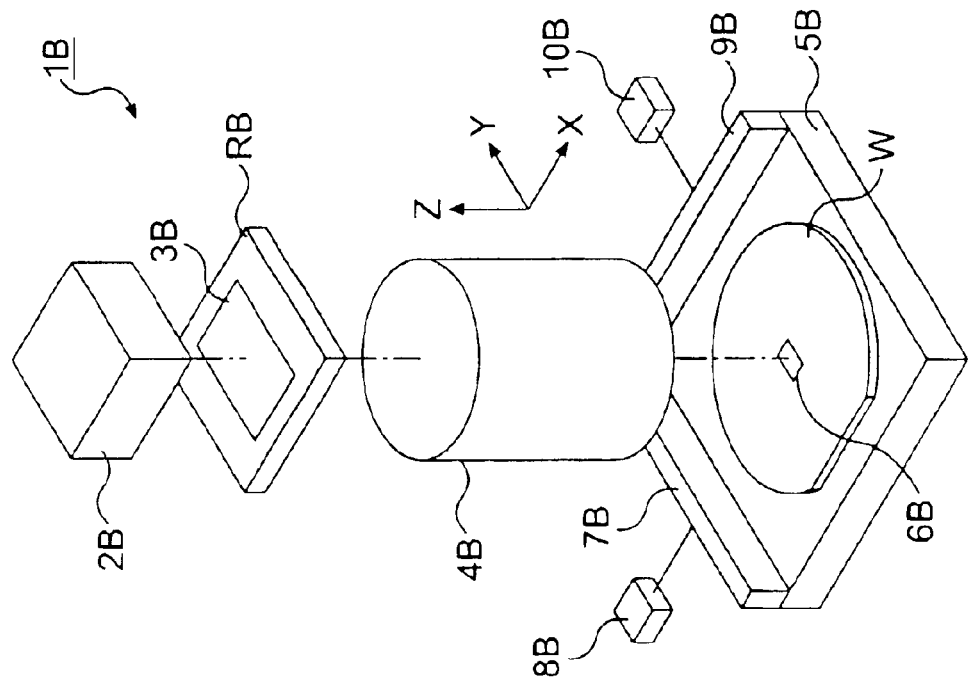
FIG. 12 illustrates the exposure system of the present invention.
Figure 12:
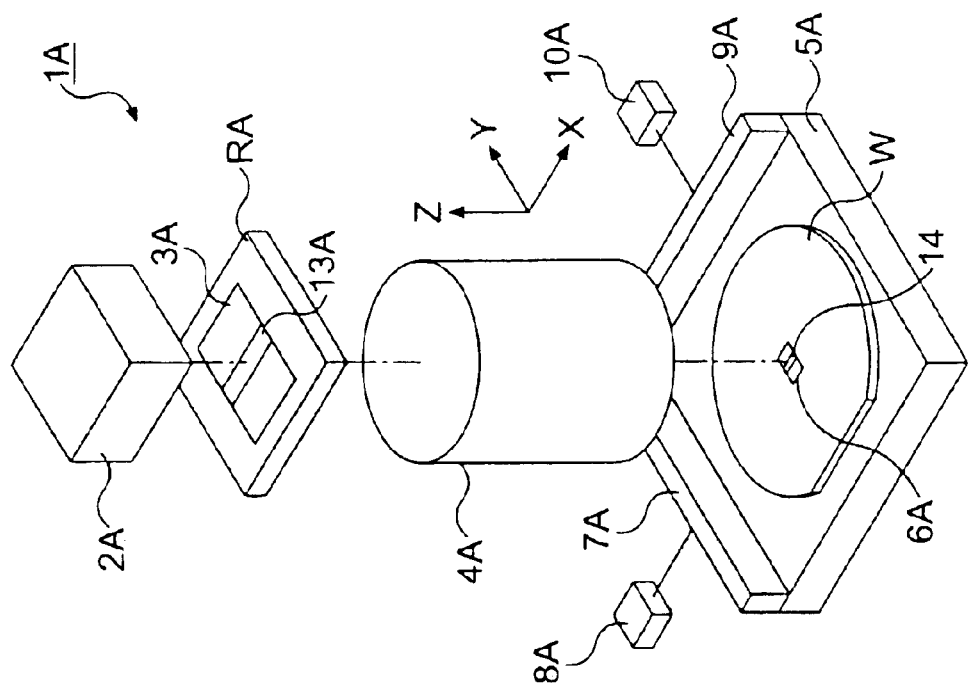

FIG. 12 shows the exposure system of the present example. In this figure, the projection exposure apparatus of the Step and Scan method (hereinafter referred to as a "scanner") 1A is arranged, and the projection exposure apparatus of the batch exposure method (hereinafter referred to as a "Stepper") 1B is arranged. In the present example, the Scanner 1A has a high resolution and the Stepper 1B has a low resolution. Using the scanner 1A, exposure of the critical layer is performed on the wafer; and using the stepper 1B, exposure of the middle layer is performed on the wafer.

First, in the scanner of FIG. 12, the portion 13A of pattern area 3A of the reticle RA is illuminated by the exposure light from the illumination system 2A, and a portion of the pattern image thereof is reduced to ¼ size through the projection optical system 4A whereby it is projection exposed to the slit shaped exposure area 14 on the wafer W that is held on top of the wafer stage 5A. Here, in the same manner as in FIG. 1, the Z axis is placed parallel to the optical axis of the projection optical system 3A thereby making the X axis and the Y axis to be on intercepting coordinates on a flat plane orthogonal to the Z axis. In this state, by having the reticle RA scan in the −Y direction (or the +Y direction) while simultaneously having the wafer W scan in the +Y direction (or the −Y direction), the pattern image within the pattern area 2A of the reticle RA will be consecutively projected to the exposure field 6A on the wafer W.

The position of the reticle stage not shown in the figure that scans the reticle RA of the scanning type exposure device 1A is measured by a laser interferometer not shown in the figure, and the X coordinates of the wafer stage 5A is measured by the moving mirror 7A and the laser interferometer 8A, and the Y coordinates of the wafer stage 5A is measured by the moving mirror 9A and the laser interferometer 10A, and each of the measured coordinates are supplied to a control device not shown in the figure. This control device also controls the synchronized movement of the reticle stage not shown in the figure and the wafer stage 5A.

Moreover, as such a scanner, the devices disclosed in, for example, U.S. Pat. Nos. 5,194,893, and 5,473,410, and 5,477,304 can be used. The present invention incorporates by reference the teaching of each of these patents.

Next, with the Stepper 1B, the pattern area 3B on the reticle RB is illuminated by the exposure light from the illumination system 2B, and the pattern in the pattern area 3B is reduced to ¼ size by the projection optical system 4B whereby it is projection exposed to the rectangular exposure field 6B of the wafer W. The wafer W is secured to the wafer stage 5B, and the wafer stage 5B is constructed from the Z stage that establishes the exposure plane of the wafer W in the Z axis direction into the best focus position, and from the XY stages that determine the position of the wafer W in the direction of the X axis and the Y axis. There are two movement mirrors 7B and 9B fixed to the wafer stage 5B so as to be orthogonal, and the coordinates of the X direction of the wafer stage 6B are measured by the movement mirror 7B and the laser interferometer 8B being attached on the exterior, while the coordinates of the Y direction of the wafer stage 6B are measured by the movement mirror 9B and the laser interferometer 10B being attached on the exterior. The coordinates that are measured by the laser interferometers 8B and 10B are supplied to the control device not shown in the figure that controls the movement of the entire device, and this control device, performs the position determination of the wafer W by the stepping drive of the wafer stage 6B through the drive component not shown in the figure, in the X direction and the Z direction.

Figure 13A:
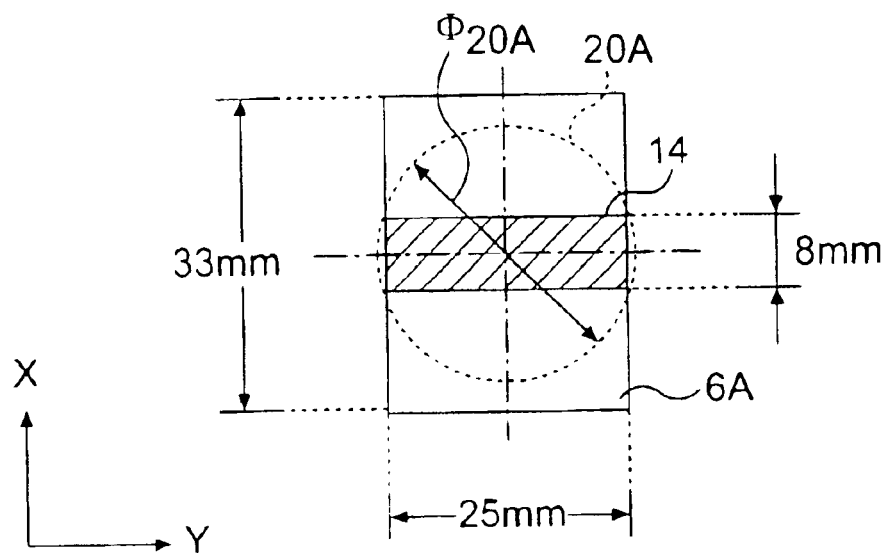
FIG. 13A illustrates the relation between the exposure area, the image field, and the exposure area.

Now, as shown in FIG. 13A, the projection optical system 4A of the scanner 1A of the present example has a circular image field 20A with a diameter of $\phi_{20A}$. Furthermore, the slit shaped exposure area 14 is of a size of 25 mm×8 mm, and it is nearly inscribed within the circular image field 20A. Since this slit shaped exposure area 14 is scanned (swept) along the direction of the X axis in the figure over the wafer W, it becomes possible for the exposure field 6A of 25 mm×33 mm to be formed over the wafer W. Moreover, in the present example, $\phi_{20A}$=26.4 mm.

Figure 13B:
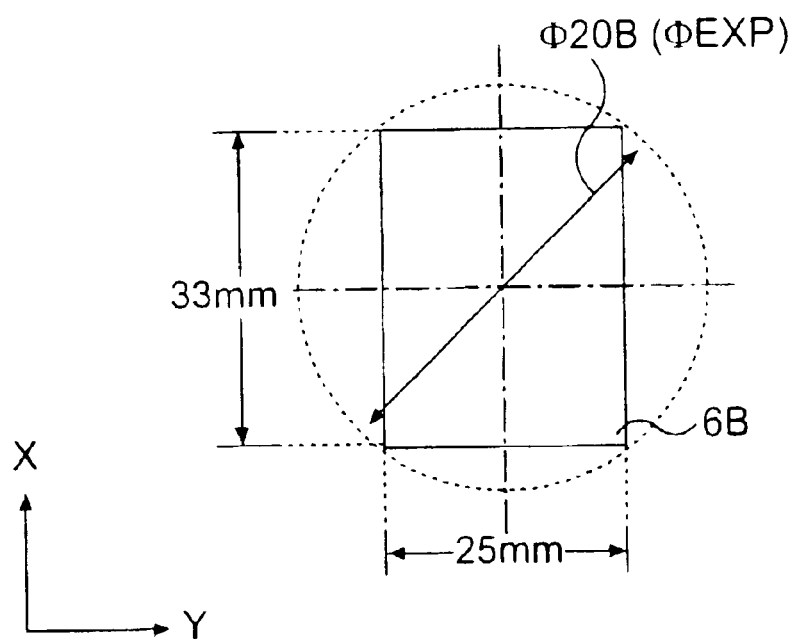
FIG. 13B illustrates the relation between the image field and the exposure field.

Furthermore, as shown in FIG. 13B, the projection optical system 4B of the stepper 1B of the present example has a circular image field 20B with a diameter of $\phi_{20B}$ (the $\phi$exp in the embodiment described above). Furthermore, the exposure field 6B that is formed at the time of the batch exposure over the wafer W is a size of 25 mm×33 mm. Moreover, in the present example, $\phi_{20B}$=42 mm.

The construction of the stepper 1B of the present example will be explained with reference to FIG. 14. The light source L from the ultra high pressure mercury vapor lamp that supplies a light that includes an emission light of an i line for example, is arranged in the one focal point of the ellipse mirror 11, and the light from the light source L, after passing through the folding mirror FL1, gathers in the other focal point of the ellipse mirror 11 thereby forming a light source image. In the vicinity of this light source image, the shutter 13 is arranged for turning ON and OFF the exposure light. The light that passes through the shutter 13 is converted into a nearly parallel beam through the input lens 14 whose position is determined by the first (frontwise) focal point positioned in the vicinity of the light source image. A comatic prism 15 having a concave cone shape at the entry plane and a convex cone shape at the exit plane, is arranged to be in the optical path of the beam from the input lens 14, and the light that travels via this comatic prism 15 is converted into an annular shaped (a doughnut shaped) beam where the cross-section has a light intensity distribution of an annular (doughnut) shape.

This type of comatic prism is disclosed in, for example, U.S. Pat. No. 4,498,742. Moreover, with the comatic prism disclosed in this patent, the entry side and the exit side are used in opposite directions. The present invention incorporates by reference the teaching of U.S. Pat. No. 4,498,742 described above.

The annular shaped beam from the comatic prism 15 enters the fly's eye lens FE that is formed by integrating a plurality of bar shaped lens elements into a two dimensional matrix. The aggregate, or in other words, the planar light source (secondary light source) of the light source image that is collected by each of the bar-shaped lens elements is formed in the vicinity of the exit plane of the fly's eye lens FE. Here, since the light intensity distribution of the cross-section of the entry beam into the fly's eye lens FE is nearly annular shaped, the shape of the secondary light source also becomes annular shaped.

In the present example, the illumination aperture stop S (σ(sigma) stop S) having a circular shaped opening is arranged to the planer light source forming position. Moreover, this planer light source forming position is conjugate with the pupil position of the projection optical system 4B (PL) to be described hereafter, and it is called the illumination pupil of the illumination system. Moreover, the shape of the opening of the illumination stop shape S is best if it is an annular shape.

In this manner, in the present example, the light intensity distribution of the secondary light source occurring in the illumination pupil is set so that the light intensity at the pupil center area including the optical axis is smaller than the peripheral area of said pupil center area.

The light from the illumination aperture stop S is collected by the condenser lens system 17a and 17b being positioned by the first (frontwise) focal point in the planer light source forming position, and it illuminates in superposing manner the illumination field stop 18 heavily the illumination field of view diaphragm 18 having a rectangular shaped opening that is similar to the shape of the pattern area 3B over the reticle RB.

The beam that passed through the illumination field stop 18 passes through the illumination field stop image forming optical system 19a through 19c that works optically conjugate with the illumination field stop 18 and the pattern plane of the reticle RB (wafer W plane), as well as the folding mirror FL2 that is arranged at the illumination field stop image forming optical system thereby reaching the reticle RB. At this time, the illumination area that is the image of the opening of the illumination field stop 18 is formed on the reticle RB.

The reticle RB, in the same manner as shown in FIG. 1, is held by way of the reticle holder RH, and this reticle holder RH is secured parallel to the XY plane on the reticle stage RS. The reticle stage RS in the FIG. 14 is constructed so as to be movable in XY direction and to be rotatable about rotating direction (θz direction) with the Z axis as the center, and these rotation position coordinates are measured by the interferometer 12B using the moving mirror 11B including a corner cube or so forth. Further, the rotation position control of the reticle RB is done by way of the drive component not shown in the figure.

The light from the pattern formed by the reticle RB, through the projection optical system 4B (PL), forms the reduced image of the pattern in the pattern area 3B on the reticle RB within the exposure field on the wafer W that is applied by the photosensitive material. Moreover, the projection optical system of any of the embodied examples 1 through 3 described above can be applied as the projection optical system 4B (PL). An aperture stop as with a variable aperture diameter is arranged in the vicinity of the pupil position of this projection optical system 4B (PL).

The wafer W, similar to the example shown in FIG. 1, is held by the wafer holder WH, and the wafer holder WH is attached to the wafer stage WS with the ability to move within the XY plane.

Figure 14:
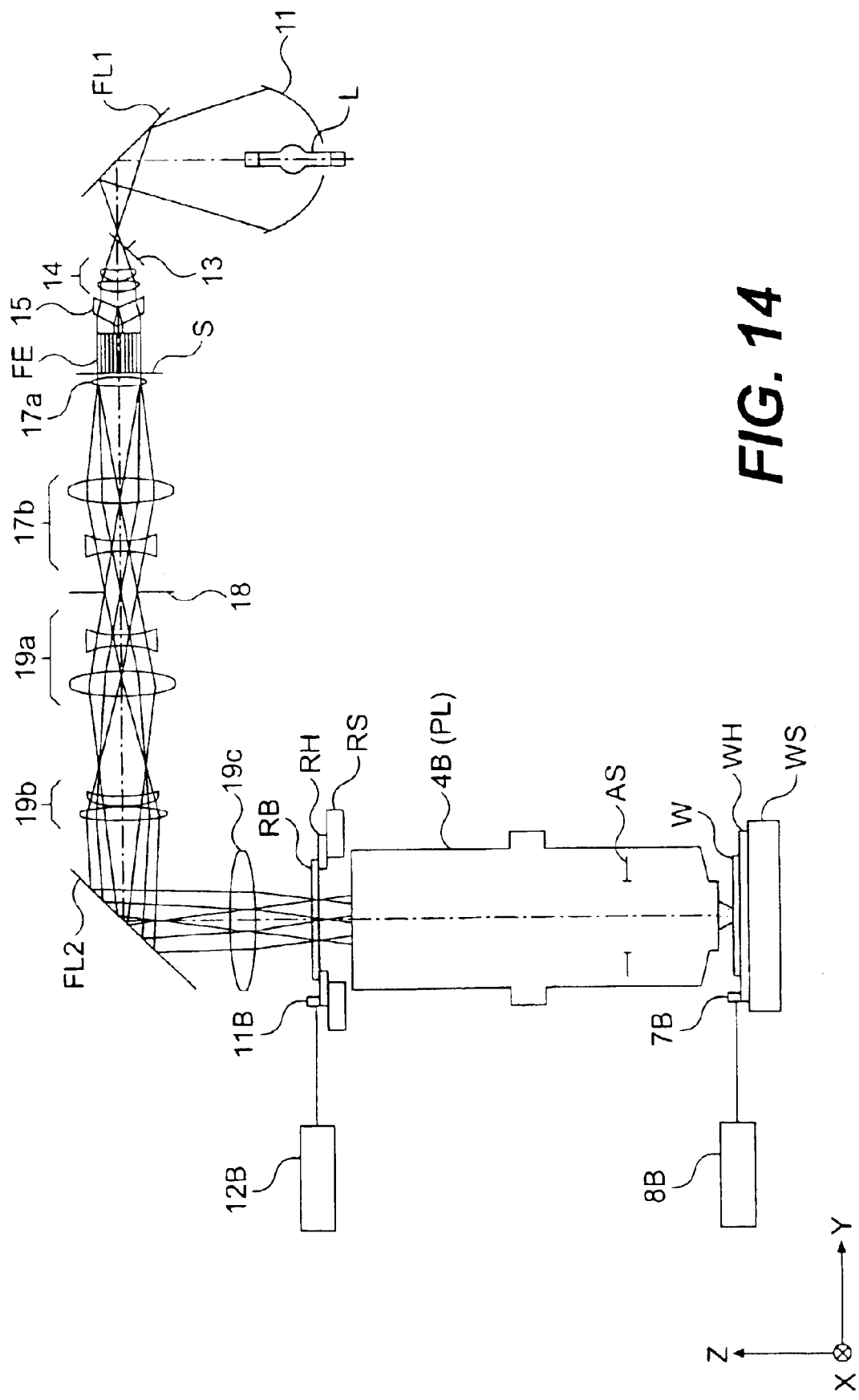
FIG. 14 is a schematic view of the projection exposure apparatus shown in FIG. 12.

In this manner, as in the example of FIG. 14, the pattern on the reticle can be projection exposed onto the wafer by using the annular illumination. Moreover, this type of projection exposure apparatus is disclosed in, for example, U.S. Pat. No. 5,530,518, and the teachings of U.S. Pat. No. 5,530,518 are hereby incorporated by reference.

Now, with the projection exposure apparatus of the present example, since the light intensity distribution of the secondary light source occurring in the illumination pupil is set so that the light intensity at the pupil central area including the optical axis is smaller than the peripheral area of said pupil central area, and since it is possible to minimize the irradiation expansion of the optical elements in the projection optical system, it becomes possible to maintain a high image formation performance.

Furthermore, in the case when the distribution of the secondary light source occurring in the illumination pupil is annularly shaped, it is best when the annular ratio of inner diameter to outer diameter of the annular shaped light intensity distribution is set to be within the range of 0.3 through 0.7. Here, when the lower limit value of the range described above is exceeded, the inner diameter of the annular shaped secondary light source becomes too small, and it becomes difficult to improve depth of focus as well as resolution of the projection optical system. On the other hand, when the exceeding the upper limit value of the range described above, the width of each line forming a pattern or patterns on a reticle, which width is uniform and the same, becomes uneven or varied depending on repetition of the lines or line-to-line distances of the pattern when transferred onto the wafer. Accordingly, it is not possible to transfer the pattern on the reticle onto the wafer accurately. Further, since the degree of variance of the line width to the exposure variance amount becomes greater, it becomes difficult to form a pattern of a desired line width on the wafer.

With the present example, with the ratio of the inner diameter to the outer diameter of the annular shaped light intensity distribution, the so-called annular ratio becomes set at nearly ⅓, and by using the projection optical system that relates to either of the embodied examples 1 through 3 described above, it becomes possible to achieve a resolving power (resolution) of 0.35 nm in the image field diameter of 42 mm on the wafer. Accordingly, with the stepper 1B of the present example, it is possible to perform batch exposure under a resolving power of 0.35 nm with respect to the exposure field of 25 mm×33 mm that is inscribed in the image field of a diameter of 42 mm.

Moreover, with the projection exposure apparatus of the present example, by using the comatic prism 15, and since annular illumination can be performed essentially without loss of light quantity, there is little risk of bringing about the reduction of the throughput.

In the example shown in the FIG. 14, the fly's eye lens FE is used as the optical integrator. However, a Rod type integrator (a internal reflection type integrator, a light pipe, a light tunnel, a glass rod, etc.) can be used as the optical integrator. The combination of the rod type integrator and the annular illumination is described in, for example, U.S. Pat. Nos. 5,359,388; 5,330,518; 5,675,401; 5,648,715. The present invention incorporates by reference the teachings of each of these patents.

Figure 15:
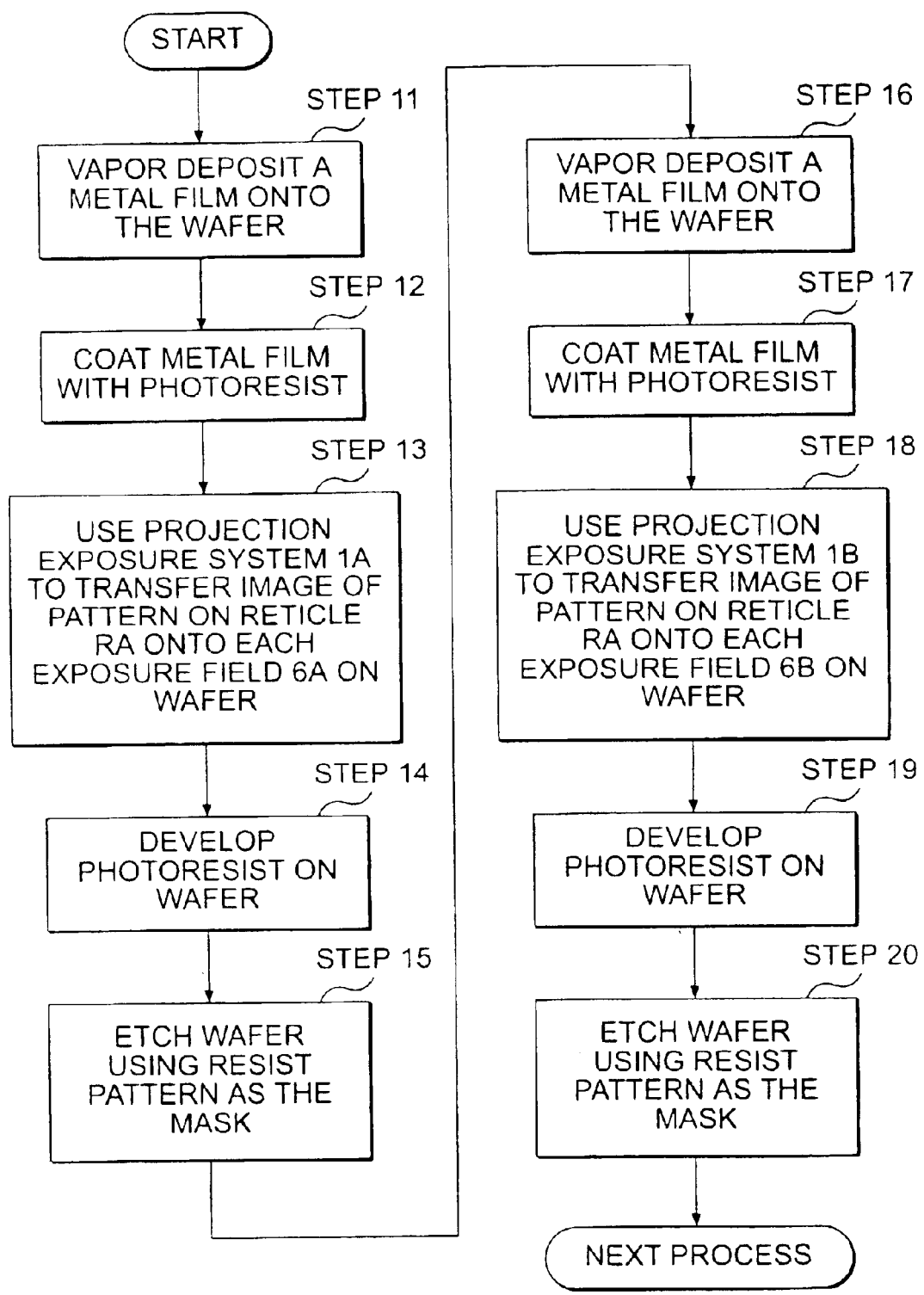
FIG. 15 is a flow diagram illustrating an exemplary exposure process of the present invention.

Next, a description of one example of the exposure action or process occurring in the exposure system indicated in FIG. 12 will be given with reference to FIG. 15. In the following description, an example of the exposure of the middle layer after the exposure of the critical layer will be given.

In Step 11, a metal film is arranged on one lot of wafers. In the next Step 12, the photoresist is applied as a photosensitive material onto the metal film on the one lot of wafers.

Thereafter, in Step 13, the wafer W is positioned on the wafer stage 5A of the scanner 1A of FIG. 12, and the reduced image of the pattern of the reticle RA is exposed with the sequential Step and Scan method to the multiple shot areas that are arranged with the exposure field 6A as the unit on the wafer W.

Thereafter, the photoresist is developed on the exposed one lot of wafers in Step 14, and in Step 15, the one lot of wafers is etched using the developed resist pattern as a mask. In this manner, the processing of the critical layer is completed.

Next, in Step 16, a metal film is attached onto the one lot of wafers described above. In the next step 17, the photoresist is applied as a photosensitive material on the metal film on the one lot of wafers thereof.

Furthermore, in Step 18, this wafer is positioned on the wafer stage 5B of the Stepper 1B of FIG. 12, and the batch exposure of the reduced image of the pattern of the reticle RA is repeated by the sequential Step and Repeat method to the multiple shot areas being arranged with the exposure field 6B as the unit on the wafer W.

Thereafter, in Step 19, the photoresist is developed on the exposed one lot of wafers, and in Step 20, the one lot of wafers is etched using the developed resist pattern as a mask. In this manner, the processing of the middle layer is completed.

In actuality, the exposure of the critical layer and the exposure of the middle layer is repeated until the circuit pattern of the top layer is formed and as a result, the semiconductor device is manufactured.

Furthermore, in the example described above, the exposure of the middle layer was performed after the exposure of the critical layer, however, the case may exist where the opposite occurs, in other words, the exposure of the critical layer is performed after the exposure of the middle layer. In such a case, with the description given above, the exposure occurring by way of the Scanner 1A and the exposure by way of the Stepper 1B can be interchanged.

In the example described above, since the Stepper 1B has the same exposure field size as maximum exposure field size (e.g., 25×33 mm, 26×33 mm) of the Scanner 1A, it is possible to obtain maximum throughput on the Scanner, to obtain tight overlay control, and to simplify matching strategy. Since the Stepper 1B has same projection magnification as the Scanner 1B thereof, it is possible to secure reticle compatibility.

On the other hand, in the case where the Stepper 1B has a smaller exposure field size (e.g., 22×22 mm) than the maximum exposure field size of the Scanner 1A, the exposure field size of the Scanner 1A must be greatly limited in order to obtain concentric matching and avoid decreasing throughput. In the case where the Stepper 1B has a smaller exposure field size than the maximum exposure field size of the Scanner 1A, the exposure field size of the Scanner 1A does not need to be limited in order to establish non-concentric matching (e.g., 2 in 1 or 3 in 1 non-concentric matching (two or three stepper fields within one scanner field)). However, the distortion fingerprint in the exposure field of the Scanner 1A needs to overlay the distortion fingerprints in two or three exposure fields of the Stepper 1B, thereby bringing about difficulty in overlay control.

In the case where the projection magnification of the Stepper 1B differs from the Scanner thereof, reticle incompatibility is brought about.

Furthermore, in the example described above, the same projection magnification ratio was used for the Stepper 1B for the middle layer exposure and the Scanner 1A for the critical layer exposure, but these projection magnification ratios can also be different when reticle compatibility is not required.

Further, in the example described above, the same size (25 mm×33 mm) was established for the exposure field 6A of the Scanner 1A for the critical layer exposure and the exposure field 6B of the Stepper 1B for the middle layer exposure. However, as long as the exposure field 6B of the Stepper for the middle layer exposure is of a size that can encompass the exposure field 6A of the scanning type exposure device 1A, it is acceptable when simple matching strategy and tight overlay controller reticle compatibility are not required. Furthermore, the exposure field 6B of the Stepper 1B for the middle layer exposure is not limited to a size of 25 mm×33 mm. It may also be an exposure field that encompasses an area of 25 mm×33 mm such as, for example, 26 mm×33 mm.

Moreover, in the example described above, the slit shaped exposure area of the Scanner 1A for the critical layer exposure is not limited to 25 mm×8 mm. It may be a size of, for example, 25 mm×6 mm or 26 mm×6 mm.

With each of the Embodiments described above, the present invention can be applied to a projection exposure apparatus that is used in the manufacture of a semiconductor element device. Moreover, the present invention is not limited to only a projection exposure apparatus used in the manufacture of a semiconductor element device. Instead, the present invention can be applied to an exposure apparatus that transfers a device pattern onto a glass or a plastic plate and which is used in the manufacture of a flat panel display such as a LCD (liquid crystal display), a PDP (plasma display panel), EL (electroluminescent) display, FED (field emission display), Electric Paper display, etc., or an exposure apparatus that transfers a device pattern onto a ceramic wafer and which is used in the manufacture of a thin film magnetic head, or an exposure apparatus that is used in the manufacture of an image pickup device such as a CCD (charged-coupled device) and so forth. Furthermore, the present invention can also be applied to an exposure apparatus that transfers a circuit pattern to a silicon wafer or a glass substrate in order to manufacture a reticle or a mask.

Additionally, the present invention is not limited to the forms of the embodiments described above. Indeed, the present invention encompasses various combinations of compositions that do not exceed the bounds of the essence of the present invention.

Other embodiments of the invention will be apparent to those skilled in the art from consideration of the specification and practice of the invention disclosed herein. It is intended that the specification and examples be considered as exemplary only. Thus, it should be understood that the invention is not limited to the illustrative examples in this specification. Rather, the invention is intended to cover all modifications and variations that come within the scope of the following claims and their equivalents.

What is claimed is:

1. A projection optical system for projecting onto a workpiece a reduced image pattern arranged on a mask based on the exposure light of a predetermined wavelength, comprising:

a plurality of optical elements arranged to each receive the exposure light, each of the plurality of optical elements being shaped and positioned such that both sides of the mask and the workpiece are set to be telecentric;

wherein the plurality of optical elements comprises:
a first lens group arranged between a first object and a second object;
a second lens group having a negative power, and arranged between the first lens group and the second object;
a third lens group having a positive power and arranged between the second lens group and the second object;
a fourth lens group having a negative power and arranged between the third lens group and the second object;
a fifth lens group having a positive power and arranged between the fourth lens group and the second object;
wherein two lens surfaces of the first lens group satisfy the condition $\phi_1/\phi_{exp} \leq 3.5$, the first material satisfies the condition $n_1 \leq 1.57$, the projection optical system including a second lens made of a second material, two lens surfaces of the second lens satisfy the condition $\phi_1/\phi_{exp} > 3.5$, and the second material satisfies the condition $n_2 > 1.57$, where
$\phi_{exp}$ is designated as a diameter of an exposure area on the second object, $\phi_1$ is designated as a diameter of a clear aperture of the two lens surfaces of the first lens group, $\phi_2$ is designated as a diameter of a clear aperture of the two lens surfaces of the second lens, and $n_1$ is designated as a refractive index of the first lens, and $n_2$ represents a refractive index of the second lens; and wherein the projection optical system includes an image circle having a diameter of at least 42 mm and a maximum value of a numerical aperture at a side of the workpiece is determined to be greater than or equal to 0.5.

2. The projection optical system of claim 1, wherein each of the plurality of optical elements is arranged along an optical axis that extends along a straight line.

3. The projection optical system of claim 1, wherein a sum of axial thickness of a first lens in the fifth lens group divided by a sum of axial thickness of all lenses in the fifth lens group is greater than or equal to 0.2.

4. The projection optical system of claim 3, wherein at least one conditional expression is satisfied among the following conditional expressions:

$0.04 < f_1/L < 0.4$ $0.015 < f_2/L < 0.15$ $0.02 < f_3/L < 0.2$ $0.015 < f_4/L < 0.15$ $0.03 < f_5/L < 0.3$, where the focal length of the first lens group is designated as $f_1$, the focal length of the second lens group is designated as $f_2$, the focal length of the third lens group is designated as $f_3$, the focal length of the fourth lens group is designated as $f_4$, the focal length of the fifth lens group is designated as $f_5$, and L is designated as the axial distance between the first object and the second object.

5. The projection optical system of claim 4, wherein a maximum clear aperture among clear apertures of negatives lenses in the fifth lens group divided by a maximum clear aperture among clear apertures of a plurality of lenses in the fifth lens group is greater than or equal to 0.7.

6. The projection optical system of claim 5, wherein the focal length of the projection optical system divided by the distance between the first object and the second object is greater than or equal to 0.6.

7. The projection optical system of claim 1, wherein at least one conditional expression is satisfied among the following conditional expressions:

$0.04 < f_1/L < 0.4$ $0.015 < f_2/L < 0.15$ $0.02 < f_3/L < 0.2$ $0.015 < f_4/L < 0.15$ $0.03 < f_5/L < 0.3$, where the focal length of the first lens group is designated as $f_1$, the focal length of the second lens group is designated as $f_2$, the focal length of the third lens group is designated as $f_3$, the focal length of the fourth lens group is designated as $f_4$, the focal length of the fifth lens group is designated as $f_5$, and L is designated as the axial distance between the first object and the second object.

8. The projection optical system of claim 7, wherein each the following conditional expressions are satisfied simultaneously:

$0.04 < f_1/L < 0.4$ $0.015 < f_2/L < 0.15$ $0.02 < f_3/L < 0.2$ $0.015 f_4/L < 0.15$ $0.03 < f_5/L < 0.3$.

9. The projection optical system of claim 8, wherein a maximum clear aperture among clear apertures of negatives lenses in the fifth lens group divided by a maximum clear aperture among the clear apertures of a plurality of lenses in the fifth lens group is greater than or equal to 0.7.

10. The projection optical system of claim 9, wherein the focal length of the projection optical system divided by the distance between the first object and the second object is greater than or equal to 0.6.

11. The projection optical system of claim 1, wherein a maximum clear aperture among clear apertures of negatives lenses in the fifth lens group divided by a maximum clear aperture among the clear apertures of a plurality of lenses in the fifth lens group is greater than or equal to 0.7.

12. The projection optical system of claim 11, wherein each of the following conditional expressions are satisfied simultaneously:

$0.04 < f_1/L < 0.4$ $0.015 < f_2/L < 0.15$ $0.02 < f_3/L < 0.2$ $0.015 f_4/L < 0.15$ $0.03 < f_5/L < 0.3$.

13. The projection optical system of claim 12, wherein the focal length of the projection optical system divided by the distance between the first object and the second object is greater than or equal to 0.6.

14. The projection optical system of claim 1, wherein the focal length of the projection optical system divided by a distance between the first object and the second object is greater than or equal to 0.6.

15. The projection optical system of claim 14, wherein each of the following conditional expressions are satisfied simultaneously:

$$0.04 < f_1/L < 0.4$$

$$0.015 < f_2/L < 0.15$$

$$0.02 < f_3/L < 0.2$$

$$0.015 < f_4/L < 0.15$$

$$0.03 f_5/L < 0.3.$$

16. A projection exposure apparatus for projecting an image of patterns formed on a mask onto a workpiece, comprising:

a first stage that secures a mask as a first object;

an illumination system that illuminates an exposure light of a predetermined wavelength;

a second stage that secures the workpiece as a second object; and a projection optical system of claim 1, which is arranged in an optical path between the mask and the workpiece.

17. A method for transferring a pattern arranged on a mask onto a workpiece, comprising the steps of:

providing a projection optical system of claim 1;

illuminating the mask by use of a predetermined wavelength; and operating the projection optical system so as to form in one lot a reduced image of an illuminated the mask into a predetermined field on the workpiece.

18. The projection optical system of claim 1, wherein the first lens group has a positive power.

* * * * *

UNITED STATES PATENT AND TRADEMARK OFFICE
CERTIFICATE OF CORRECTION

PATENT NO. : 6,947,121 B2
DATED : September 20, 2005
INVENTOR(S) : Shigematsu, Koji It is certified that error appears in the above-identified patent and that said Letters Patent is hereby corrected as shown below:

Column 25,
Line 67, "negatives" should read -- negative --.

Column 26,
Lines 37 and 63, "$0.015f_4/L<0.15$" should read -- $0.015<f_4/L<0.15$ --.
Lines 41 and 50, "negatives" should read -- negative --.

Column 27,
Line 17, "$0.03f_5/L<0.3$." should read -- $0.03<f_5/L<0.3$. --.

Column 28,
Line 16, "illuminated the mask" should read -- illuminated mask --.

Signed and Sealed this

Twenty-first Day of February, 2006

JON W. DUDAS
*Director of the United States Patent and Trademark Office*